(12) United States Patent
Yano et al.

(10) Patent No.: US 8,795,554 B2
(45) Date of Patent: Aug. 5, 2014

(54) SPUTTERING TARGET FOR OXIDE SEMICONDUCTOR, COMPRISING INGAO3(ZNO) CRYSTAL PHASE AND PROCESS FOR PRODUCING THE SPUTTERING TARGET

(75) Inventors: Koki Yano, Sodegaura (JP); Hirokazu Kawashima, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 511 days.

(21) Appl. No.: 13/001,511

(22) PCT Filed: Jun. 26, 2009

(86) PCT No.: PCT/JP2009/061702
§ 371 (c)(1),
(2), (4) Date: Mar. 23, 2011

(87) PCT Pub. No.: WO2009/157535

PCT Pub. Date: Dec. 30, 2009

(65) Prior Publication Data

US 2011/0180392 A1    Jul. 28, 2011

(30) Foreign Application Priority Data

Jun. 27, 2008   (JP) ................... 2008-169165

(51) Int. Cl.

| | |
|---|---|
| *H01B 1/00* | (2006.01) |
| *H01L 29/786* | (2006.01) |
| *C23C 14/08* | (2006.01) |
| *C04B 35/453* | (2006.01) |
| *C04B 35/01* | (2006.01) |
| *C23C 14/34* | (2006.01) |
| *H01L 21/02* | (2006.01) |

(52) U.S. Cl.
CPC ..... *C23C 14/3414* (2013.01); *C04B 2235/3286* (2013.01); *H01L 21/02565* (2013.01); *H01L 21/02554* (2013.01); *H01L 29/7869* (2013.01); *H01L 21/02631* (2013.01); *C04B 2235/725* (2013.01); *C23C 14/08* (2013.01); *H01L 21/02592* (2013.01); *C04B 35/453* (2013.01); *C04B 2235/5409* (2013.01); *C04B 35/01* (2013.01); *C04B 2235/404* (2013.01); *C04B 2235/40* (2013.01); *C04B 2235/3284* (2013.01)
USPC ...................... 252/500; 204/298.13

(58) Field of Classification Search
USPC ...................... 252/500; 204/298.13
See application file for complete search history.

(56) References Cited

U.S. PATENT DOCUMENTS

| | | | |
|---|---|---|---|
| 5,622,653 | A | 4/1997 | Orita et al. |
| 5,681,671 | A | 10/1997 | Orita et al. |

(Continued)

FOREIGN PATENT DOCUMENTS

| | | |
|---|---|---|
| JP | 3947575 | 9/1996 |
| JP | 2003 041362 | 2/2003 |

(Continued)

OTHER PUBLICATIONS

Canon, Inc., "Method for manufacturing thin film transistor using amorphous oxide semiconductor film," Patent Abstracts of Japan, Publication Date: Mar. 6, 2008; English Abstract of JP-2008 053356.

(Continued)

*Primary Examiner* — Khanh Tuan Nguyen
(74) *Attorney, Agent, or Firm* — Millen, White, Zelano & Branigan, P.C.

(57) ABSTRACT

Disclosed is a sputtering target for an oxide semiconductor, comprising In, Ga, and Zn. Also disclosed are a process for producing the sputtering target, a thin film of an oxide semiconductor using a sputtering target, and a method for thin-film transistor formation. The sputtering target comprises an oxide sintered compact containing a compound having a homologous crystal structure represented by InGaO$_3$(ZnO) and exhibits such an X-ray diffraction pattern that the proportion of peaks at 2θ=62 to 63 degrees to the maximum peak of InGaO$_3$(ZnO) is not more than 3%.

17 Claims, 10 Drawing Sheets

(56) References Cited

U.S. PATENT DOCUMENTS

| | | | |
|---|---|---|---|
| 5,843,341 | A | 12/1998 | Orita et al. |
| 5,955,178 | A | 9/1999 | Orita et al. |
| 7,306,861 | B2 | 12/2007 | Inoue et al. |
| 7,393,600 | B2 | 7/2008 | Inoue et al. |
| 7,611,646 | B2 | 11/2009 | Nakayama et al. |
| 7,635,440 | B2 | 12/2009 | Hosono et al. |
| 7,718,095 | B2 | 5/2010 | Hosono et al. |
| 8,080,182 | B2 | 12/2011 | Nakayama et al. |
| 8,093,800 | B2 | 1/2012 | Inoue et al. |
| 2004/0081836 | A1 | 4/2004 | Inoue et al. |
| 2004/0180217 | A1 | 9/2004 | Inoue et al. |
| 2004/0222089 | A1 | 11/2004 | Inoue et al. |
| 2006/0234088 | A1 | 10/2006 | Inoue et al. |
| 2007/0184286 | A1 | 8/2007 | Nakayama et al. |
| 2008/0054959 | A1 | 3/2008 | Fujisawa et al. |
| 2008/0308774 | A1 | 12/2008 | Inoue et al. |
| 2008/0309223 | A1 | 12/2008 | Inoue et al. |
| 2009/0325341 | A1 | 12/2009 | Itagaki et al. |
| 2010/0009157 | A1 | 1/2010 | Nakayama et al. |
| 2010/0108502 | A1 * | 5/2010 | Inoue et al. ............. 204/298.13 |
| 2010/0167000 | A1 | 7/2010 | Hosono et al. |
| 2010/0240521 | A1 | 9/2010 | Hosono et al. |
| 2014/0001040 | A1 | 1/2014 | Inoue et al. |

FOREIGN PATENT DOCUMENTS

| | | | | |
|---|---|---|---|---|
| JP | 3644647 | | 5/2005 | |
| JP | 2005 232471 | | 9/2005 | |
| JP | 2005 307269 | | 11/2005 | |
| JP | 2007-073312 | * | 3/2007 | ............. H01B 13/00 |
| JP | 2007 073312 | | 3/2007 | |
| JP | 2007 223849 | | 9/2007 | |
| JP | 2008 053356 | | 3/2008 | |
| TW | 200641174 A | | 12/2006 | |
| TW | 200732254 A | | 9/2007 | |
| TW | I316093 B | | 10/2009 | |
| WO | WO-03 014409 | | 2/2003 | |
| WO | WO-2004 079038 | | 9/2004 | |
| WO | WO 2008/072486 A1 * | | 6/2008 | ............. C04B 35/00 |

OTHER PUBLICATIONS

Canon, Inc., "Sputtering target, and method of forming thin film using the target," Patent Abstract of Japan, Publication Date: Mar. 22, 2007; English Abstract of JP-2007 073312.

Hoya Corp., "Electrically conductive oxide and electrode using same," Patent Abstracts of Japan, Publication Date: Sep. 24, 1996: English Abstract of JP-08 245220.

Hoya Corp., "Electrically conductive oxide and electrode using the same," Patent Abstracts of Japan, Publication Date: Nov. 11, 1996; English Abstract of JP-08 295514.

Idemitsu Kosan Co Ltd., "Indium oxide—zinc oxide—magnesium oxide-based sputtering target, and transparent electroconductive film," Patent Abstract of Japan, Publication Date: Nov. 4, 2005; English Abstract of JP-2005 307269.

International Search Report for PCT/JP2009/061702 dated Oct. 6, 2009.

Nakamura, M. et al., J. Solid State Chem, 1991, vol. 93, No. 2, pp. 298.

Nakamura, M. et al., J. Solid State Chem., 1995, vol. 116, No. 2, pp. 170.

National Institute for Materials Science, "Method for manufacturing zinc oxide-based homologous compound film," Patent Abstracts of Japan, Publication Date: Feb. 13, 2003; English Abstract of JP-2003 041362.

Nikko Materials Co Ltd., "Sputtering target, optical information recording medium, and production method therefor," Patent Abstracts of Japan, Publication Date: Sep. 2, 2005; English Abstract of JP-2005 232471.

Sumitomo Metal Mining Co Ltd., "Gallium oxide-based sintered compact and method of manufacturing the same," Patent Abstracts of Japan, Publication Date: Sep. 6, 2007; English Abstract of JP-2007 223849.

Official Action and Search Report dated Dec. 20, 2013, related to corresponding Taiwanese Patent Application No. 098121639.

* cited by examiner

FIG. 10
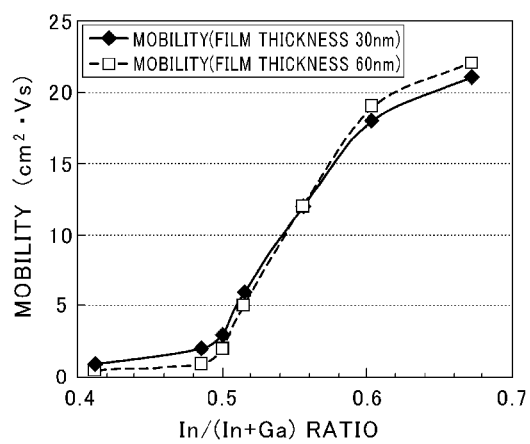
a) MOBILITY
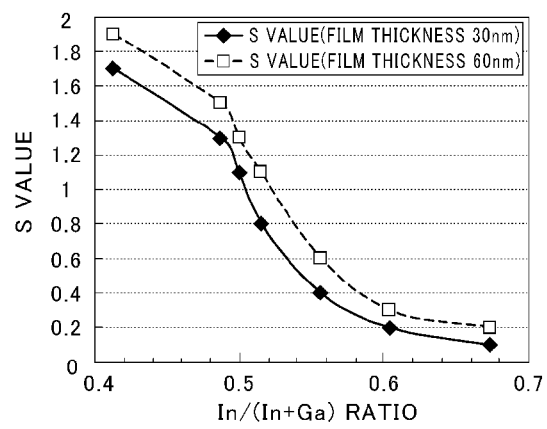
b) S VALUE

SPUTTERING TARGET FOR OXIDE SEMICONDUCTOR, COMPRISING INGAO3(ZNO) CRYSTAL PHASE AND PROCESS FOR PRODUCING THE SPUTTERING TARGET

BACKGROUND OF THE INVENTION

1. Technical Field

The present invention relates to a sputtering target for an oxide semi-conductor, comprising $InGaO_3(ZnO)$ crystal phase and a process for producing thereof, as well as a forming of an oxide semi-conductor thin film or a thin film transistor using the sputtering target.

2. Background of the Art

A field effect type transistor is widely used for a unit electron device for a semi-conductor memory integrated circuit, a high-frequency signal amplifier device, a device for driving a liquid crystal, and is the most practically used electric device.

Among the above, because of recent dramatic progress in a display device, a thin film transistor (TFT) is heavily used as a switching device for driving a display device by adding drive voltage to a display device among various kind of a display device such as a liquid crystal display device (LCD), an electroluminescence display device (EL), or a field emission display (FED).

As for the material thereof, silicon semi-conductor compounds are most commonly used. In general, single-crystal silicon is used for a high-frequency signal amplifier device or an element for integrated circuit which requires high-speed operation. Amorphous silicon is used for a device for driving a liquid crystal to meet a request for a larger-area.

However, a crystalline silicon thin film requires, for example, high temperature of 800° C. or more during crystallization, and thus it is difficult to compose it on a glass substrate or an organic material substrate. Therefore, there are several problems, for example, the film can be formed only on an expensive substrate having high heat resistance such as a silicon wafer or quartz, and the production thereof requires a lot of energy and many steps.

In addition, it was difficult for a crystalline silicon semi-conductor to uniformity make a large area semi-conductor to be applied to a big screen TV, and to reduce costs by cutting a number of masks down.

An amorphous silicon semi-conductor capable of forming under relatively low temperature (amorphous silicon) has lower mobility and slower switching speed than those of crystalline semi-conductor. Therefore, when the semi-conductor is used for a switching device for driving a display device, displaying high-speed motion picture cannot be achieved sometimes.

Currently, a switching device for driving a display device mainly uses a device using a silicon semi-conductor film. This is because, a silicon thin film has various good properties such as stability, good workability, and high switching speed. This silicon thin film is generally prepared by a chemical vapor deposition (CVD) method.

For example, a conventional thin film transistor (TFT) has an opposite stagger structure which laminates a gate electrode, a gate insulation layer, a semi-conductor layer such as a hydrogenated amorphous silicon (a-Si:H), a source electrode and drain electrode on a substrate such as a glass. This TFT is used for an image sensor, as well as a driving device for a flat panel display represented by an active matrix type liquid crystal display, within a field of a large-area device. Among these usages, high mobility is required for higher definition and higher speed in driving frequency, even though conventional amorphous silicon is used.

Under these situations, recently, an oxide semi-conductor thin film using oxides is coming up, because it is to make a large area and to reduce costs by cutting a number of masks down rather than using crystalline silicon semi-conductor, and the film has excellent stability and high mobility rather than those of an amorphous silicon semi-conductor (amorphous silicon).

However, among those types of oxide semi-conductors, an oxide semi-conductor using zinc oxide and a multi-crystalline film has low field effect mobility (hereinafter, simply said as "mobility"): about 1 $cm^2$/V·sec, and low ON-OFF ratio. In addition, leak current is easy to occur, and thus it was difficult to put it into industrial, practical use. Furthermore, many attempts were taken place for an oxide semi-conductor using zinc oxide, but the following problems were present when a film was formed by a sputtering method which is commercially and commonly used.

That is, an oxide semi-conductor film containing ZnO as a major component easily causes oxygen defect, many occurrences of carrier electrons, and difficulties in lessen electric conductivity. During film forming by using a sputtering method, abnormal discharges were occurred, stability for forming films is lost, and thus uniformity and reproducibility of the obtained film were declined. Therefore, for, example, when it is used as an active layer (channel layer) of a TFT (thin film transistor), even if no gate voltage is added, a lot of current is passed between a source terminal and a drain terminal, thus normally off of a TFT cannot be achieved. It is difficult to enlarge ON-OFF ratio of a transistor. Further, there were possibility that mobility is low, ON-OFF ratio is low, leak current is high, pinch-off is unclear, normally-ON is easy to occur, and thus properties in TFT are lowered. The obtained film has less chemical resistance, and thus process or usage environment is limited, for example, wet-etching is difficult. Further, a film must be formed under high pressure in order to improve its properties, but film-forming speed is slow as well as 700° C. or more of high temperature is required, and thus there are problems in industrialization. In addition, TFT properties such as mobility in a bottom-gate structure is low, and thus a TFT device structure is also limited, for example, top-gate structure and 200 nm or more of thickness are required for raising its properties.

In order to solve these problems, a method for producing an amorphous oxide semi-conductor film composed of indium oxide, gallium oxide and zinc oxide so as to drive a thin film transistor has been discussed. Further, there was discussion for industrially preparing an amorphous oxide semi-conductor comprising indium oxide, gallium oxide and zinc oxide by a sputtering method which is suitable for commercial production. Sputtering targets for the method were also discussed. For example, a sputtering target comprising a homologous structure of $InGaZnO_4$ ($InGaO_3(ZnO)$) in which the content of Ga in atom ratio is the same as that of In is disclosed (Patent Document 1).

In addition, a sputtering target only having a homologous structure of $InGaMgO_4$ and a sputtering target only having a homologous structure of $YbFe_2O_4$ is also disclosed (Patent Document 2). However, if a sputtering target composed of oxides comprising In, Ga, Zn is film-formed by using methods disclosed in these documents, problems were raised, e.g. the content ratio of In and Ga in atom ratio is shifted between a semi-conductor film and the sputtering target, properties of a thin film transistor was changed during long term film forming (decline in reproducibility), film-forming speed was changed during continuous film forming. In addition, it was reported that crystal of InGaO$_3$(ZnO) was obtained by sintering very small amount of a mix powder fin a platinum tube at each temperature (1150, 1250, 1350, 1550° C.) for a long time (3 to 14 days) (Non-Patent Documents 1 and 2). However, it is difficult to form a film using thus obtained crystalline powder, and thus no production method for a sputtering target which is capable of film-forming by a sputtering method was discussed.

Meanwhile, there was a discussion about an effect cased by inhibiting the formation of a Ga$_2$O$_3$ crystalline phase having high insulation (Patent Document 3). However, there was no discussion about effects by a crystalline phase where a peak between 2θ=62 degree and 63 degree based on X-ray diffraction such as a ZnGa$_2$O$_4$ crystalline phase, a In$_2$O$_3$ crystalline phase, a ZnO crystalline phase, a In$_2$O$_3$(ZnO)$_3$ crystalline phase, and a InGaO$_3$ crystalline phase.

At the same time, as an embodiment of a composition having Ga content which is smaller than In content in atom ratio, an example for forming an amorphous oxide semiconductor and a thin film transistor using an In—Ga—Zn—O sintered body having metal ratio of In:Ga:Zn=30:15:55 are disclosed (Patent Document 4). If this sintered body disclosed in this document is used as a sputtering target, several problems are occurred, for example, shifting composition ratio of In and Ga in atom ratio between a film-formed semi-conductor film and the sputtering target, low reproducibility of a thin film transistor, occurring variation during forming a thin film transistor to its large area form, and a lot of particles being appeared. Thus there was obstacle in practical use.

As for another embodiment of a composition having Ga content which is smaller than In content in atom ratio, a sputtering target comprising ZnO as a main component. However, because of ZnO being a main component, a crystalline phase other than InGaO$_3$(ZnO) was formed, density of a target becomes low, resistance becomes high, and acid-tolerance at the making of a semi-conductor film becomes low. Therefore, the target was not suitable for a field effect transistor (Patent Documents 5 and 6).

As stated above, a conventional target comprising In, Ga and Zn includes a crystalline phase other than InGaO$_3$(ZnO). Therefore, composition ratio readily shifts between a target and a film-formed semiconductor film, bulk resistance was high, uniformity was low, variation of film-forming speed during the film-forming was high, and many particles were appeared. When such a target was used for film-forming of a semi-conductor, there were problems about appearance of variation when it was prepared to its large area form.

Patent Document 1: JP-A-2007-73312
Patent Document 2: JP-B-3947575
Patent Document 3: JP-A-2007-223849
Patent Document 4: JP-A-2008-53356
Patent Document 5: WO2004/079038
Patent Document 6: JP-B-3644647
Non-Patent Document 1: M. Nakamura, N. Kimizuka and T. Mohri, J. Solid State Chem, vol. 93, No. 2, page 298, (1991)
Non-Patent Document 2: M. Nakamura, et. al., J. Solid State Chem, vol. 116, No. 2, page 170, (1995)

DISCLOSURE OF THE PRESENT INVENTION

Problems to be Solved by the Present Invention

The first object of the present invention is to provide a sputtering target having less variation (high reproducibility) in properties of a thin film transistor even if long time film forming is conducted.

The second object of the present invention is to provide a sputtering target having excellent transistor properties such as mobility, S value, ON-OFF ratio, etc. when a thin film transistor is formed.

The third object of the present invention is to provide a sputtering target comprising an oxide sintered body indicating only a homologous crystal structure represented by InGaO$_3$(ZnO), and having uniform bulk resistance and less variation in film-forming speed during film-forming.

Means for Solving the Problems

The present inventors intently made their studies and then the inventors conceived the present invention, since they found that a sputtering target comprising an oxide sintered body indicating only a homologous crystal structure represented by InGaO$_3$(ZnO) has several features, for example, composition ratio of In and Ga of the target is reflected to a semi-conductor, properties of a thin film transistor does not change much during film-forming for a long time (high reproducibility), and variation in film-forming speed during film-forming is small.

Namely, using a conventional target caused several problems, for example, the content ratio of In and Ga in atom ratio was shifted between a semi-conductor film and the sputtering target, properties of a thin film transistor was changed during film-forming for a long time (decline in reproducibility), and film-forming speed was changed during continuous film forming. However, if preparation were done by using a sputtering target having small or no peak between 2θ=62 degree and 63 degree based on X-ray diffraction for a preparation, it was found that the above problems could be solved. In addition, by using this target, a good transistor having high mobility, small S value and high ON-OFF ratio could be obtained.

It was also found that such a sputtering target comprising an oxide sintered body indicating only a homologous crystal structure represented by InGaO$_3$(ZnO) can be obtained by setting a content ratio of In and Ga within a certain range during sintering a formed body, and sintering at a certain temperature, time and atmosphere or sintering a formed body comprising a composite oxide.

The present invention may relate to the followings.
[1] A sputtering target composed of an oxide sintered body comprising a compound having a homologous crystal structure represented by InGaO$_3$(ZnO), in which a peak between 2θ=62 degree and 63 degree based on X-ray diffraction is 3% or less of the maximum peak of InGaO$_3$(ZnO).
[2] The sputtering target of [1], in which the oxide sintered body indicates only a homologous crystal structure represented by InGaO$_3$(ZnO).
[3] The sputtering target of [1] or [2] comprising an element having positive four or more valences in an amount of 100 to 10000 mass ppm.
[4] The sputtering target of any one of [1] to [3], in which atom ratio other than oxide meets the following formulae.

$0.20 \leq In/(In+Zn+Ga) \leq 0.60$ $0.10 \leq Ga/(In+Zn+Ga)$ $0.10 \leq Zn/(In+Zn+Ga)$

[5] The sputtering target of any one of [1] to [4], in which said oxide sintered body has relative density of 95% or more, an average crystalline particle diameter of 20 μm or less, and bulk resistance of 20 mΩcm or less.
[6] A method for preparing the sputtering target of any one of [1] to [5] composed of an oxide sintered body comprising In, Zn and Ga, which method comprises a step of sintering a formed body of an oxide containing a composite oxide.

[7] The method of [6], in which the composite oxide containing In, Zn and Ga.

[8] The method of [6], in which the formed body comprises one or more composite oxides selected from a composite oxide containing In and Zn, a composite oxide containing In and Ga, or a composite oxide containing Ga and Zn.

[9] A method for preparing the sputtering target of any one of [1] to [5], comprising a step of forming a composite oxide powder.

[10] The method of [9], in which sintering is conducted simultaneously with press forming during the step of forming.

[11] A method for preparing the sputtering target of any one of [1] to [5] composed of an oxide sintered body comprising In, Zn and Ga, which method comprises a step of sintering a formed body meeting the following formula of atom ratio other than oxide.

Ga<(In+Zn+Ga)<In/(In+Zn+Ga)

[12] The method of [11] comprising a step of sintering a formed body meeting the following formula of atom ratio other than oxide.

0.51≤In/(In+Zn+Ga)≤0.86

0.20≤In/(In+Zn+Ga)≤0.60

0.10≤Ga/(In+Zn+Ga)≤0.45

[13] The method of any one of [11] to [12] comprising a step of forming a crude powder so as to obtain a formed body, and sintering the obtained formed body at 1230 to 1350° C. for 3 to 60 hours, or at 1350 to 1450° C. for 0.5 to 8 hours.

[14] The method of any one of [11] to [13] in which the sintering is conducted under oxygen containing atmosphere.

[15] A method for forming an amorphous oxide semi-conductor film comprising forming the amorphous oxide semi-conductor film having specific resistance of $10^{-1}$ to $10^8$ Ωcm by a sputtering method using the sputtering target of any one of [1] to [5].

[16] The method for forming an amorphous oxide semi-conductor film of [15] in which said amorphous oxide semi-conductor film is formed as a channel layer of a thin film transistor.

[17] A sputtering target composed of a oxide sintered body comprising a compound having a homologous crystal structure represented by $InGaO_3(ZnO)$, and not comprising a $Ga_2O_3$ crystalline phase, a $ZnGa_2O_4$ crystalline phase, a $In_2O_3$ crystalline phase, a ZnO crystalline phase, a $In_2O_3(ZnO)_3$ crystalline phase, and a $InGaO_3$ crystalline phase.

Effect of the Present Invention

The present invention provides a sputtering target having less change in properties of a thin film transistor (high reproducibility) even film forming for a long time.

A sputtering target having good transistor properties such as mobility, S value and ON-OFF ratio can also be obtained when a thin film transistor is formed.

In addition, a sputtering target comprising an oxide sintered body indicating only a homologous crystal structure represented by $InGaO_3(ZnO)$, and having uniform bulk resistance and small variation in film-forming speed during film-forming can be produced.

PREFERRED EMBODIMENTS OF THE INVENTION (1) Sputtering Target

A sputtering target of the present invention is composed of an oxide sintered body comprising a compound having a homologous crystal structure represented by $InGaO_3(ZnO)$, in which a peak between 2θ=62 degree and 63 degree based on X-ray diffraction is 3% or less of the maximum peak of $InGaO_3(ZnO)$.

(1-1) Homologous Crystal Structure

"Homologous crystal structure" is a crystal structure composed of "natural superlattice" structure having long-cycle where crystalline layers having different materials are laminated. When a crystal cycle or the thickness of each thin film layer is nanometer order, unique properties different from those of a single material or a mixed crystal where each layer is uniformly mixed can be obtained by the combination of a chemical composition of said each layer or thickness of a layer. A crystal structure of a homologous phase can be confirmed by, for example, X-ray diffraction pattern of a target ground powder, or by the correspondence with X-ray diffraction pattern of a crystal structure of homologous phase assumed by composition ratio. Specifically, it can be confirmed when the pattern corresponds to X-ray diffraction pattern of a crystal structure of homologous phase obtained from JCPDS (Joint Committee of Powder Diffraction Standards) cards. The presence of $InGaO_3(ZnO)$ can be confirmed by showing if a pattern is identical to a pattern of JCPDS card No. 38-1104 based on X-ray diffraction.

If the pattern is identical (structure is identical), a peak may shift by changes of lattice constant.

The phrase "a peak between 2θ=62 degree and 63 degree based on X-ray diffraction is 3% or less of the maximum peak of $InGaO_3(ZnO)$" means that peak strength between 2θ=62 degree and 63 degree based on X-ray diffraction, which does not belong to a pattern indicating an $InGaO_3(ZnO)$ crystal structure, is 3% or less of peak strength of the maximum peak of $InGaO_3(ZnO)$ (usually in around 2θ=30.8 degree). This peak between 2θ=62 degree and 63 degree is preferably 2% or less, more preferably 1% or less, and especially preferably not observed. If the peak strength is 3% or less, it is preferable since uniformity of bulk resistance, variation of film-forming speed, and appearance of particle are improved. If no peak between 2θ=62 degree and 63 degree is observed, it is preferable since some effects can be obtained, e.g. composition ratio of In and Ga of a target is reflected to a semi-conductor, and properties of a thin film transistor are less changed (high reproducibility) when film-forming is conducted for a long time.

Peaks indicating crystals of compounds of $Ga_2O_3$, $ZnGa_2O_4$, ZnO, $In_2O_3$, $InGaO_3$, and $In_2O_3(ZnO)_3$ which do not belong to a pattern indicating an $InGaO_3(ZnO)$ crystal structure are 5% or less of the maximum peak of $InGaO_3(ZnO)$ (usually in around 2θ=30.8 degree), preferably 3% or less, and more preferably 1% or less. It is especially preferable that peaks which do not belong to a pattern indicating an $InGaO_3(ZnO)$ crystal structure are not confirmed. In the present invention, the phrase "indicates only a homologous crystal structure represented by $InGaO_3(ZnO)$" means that, if the oxide sintered body of the present invention is analyzed by X-ray diffraction, no peak belonging to pattern indicating the above crystal structures other than $InGaO_3(ZnO)$ is detected. If peaks which do not belong to pattern indicating an $InGaO_3(ZnO)$ crystal structure are small, it is preferable since uniformity of bulk resistance and variation of film-forming speed are improved. If peaks which do not belong to pattern indicating an $InGaO_3(ZnO)$ crystal structure are not confirmed, it is preferable that composition ratio of In and Ga of a target is reflected to a semi-conductor, and properties of a thin film transistor are less changed (high reproducibility) when film-forming is conducted for a long time.

The oxide crystal indicating an InGaO$_3$(ZnO)$_3$ crystal phase basically has a crystal structure having octahedral edge-sharing of InO$_6$. If there is octahedral edge-sharing of InO$_6$, it is preferable since electrically-conducting path will be formed and then mobility will become high.

The sputtering target of the present invention may contain an oxygen defect. That is, it is not necessary to meet stoichiometry. Oxygen defect ratio between the surface and the inside of a sputtering target is preferably in the range of 0.1 to 10 fold.

Area of a Ga-rich phase by the EPMA measurement of cross section of an oxide sintered body is preferably 5% or less, preferably 3% or less, and more preferably 1% or less. If the Ga-rich phase is 5% or less, some effects are expected, e.g. uniformity of bulk resistance or relative density of a target is improved.

In addition, as long as an InGaO$_3$(ZnO) crystal structure is indicated by X-ray diffraction, oxygen defect may be present.

(1-2) Containing Elements

A part of In in InGaO$_3$(ZnO) contained in an oxide sintered body of the sputtering target of the present invention is preferably subjected to solid solution substitution by a metal element (X) having positive four or more valences. In a case of solid solution substitution by a metal element (X) having positive four valences, it is preferable that bulk resistance preferably becomes more lowered. The metal element (X) having positive four or more valences contains one or more elements selected from the group consisting of tin, zirconium, germanium, cerium, niobium, tantalum, molybdenum, tungsten, and titanium. The substitution of a part of elements of In by a metal element (X) having positive four or more valences can be confirmed by a shift of interstitial distance calculated from X-ray diffraction, or structural analysis using high brightness emitted light. Specifically, lattice constant may be decided by Rietveld analysis.

If the sputtering target of the present invention contains a metal element (X) having positive four valences, an atom ratio of (the metal element (X) having positive four or more valences)/(all the metal elements in the oxide sintered body) is preferably 100 ppm to 10000 ppm, more preferably 200 ppm to 5000 ppm, especially preferably 500 ppm to 3000 ppm. An atom ratio of (the metal element (X) having positive four or more valences)/(all the metal elements in the oxide sintered body) is preferably 100 ppm or more, since effect from the addition becomes increase, bulk resistance becomes lowered, and in-plane uniformity of resistance is improved. 10000 ppm or less of an atom ratio of (the metal element (X) having positive four or more valences)/(all the metal elements in the oxide sintered body) is also preferable, because a compound represented by InGaO$_3$(ZnO) can be formed, and the oxide semi-conductor film formed by using the sputtering target of the present invention is stable.

The substitution by a metal element (X) having positive four or more valences can be confirmed by a shift of interstitial distance calculated from X-ray diffraction, or structural analysis using high brightness emitted light.

The sputtering target of the present invention contains Indium element (In), Gallium element (Ga), and Zinc element (Zn). More preferably, the target contains a metal element (X) having positive four or more valences. The metal element (X) having positive four or more valences contains one or more elements selected from the group consisting of tin, zirconium, germanium, cerium, niobium, tantalum, molybdenum, tungsten, and titanium. By adding these metal elements (X) to the oxide of the present invention, bulk resistance of the oxide itself can be lowered, and abnormal discharge appeared on a sputtering target during sputtering the oxide can be inhibited.

An oxide thin film obtained from a sputtering target using the oxide of the present invention is amorphous, the added metal having positive four valences had no doping effect, and thus a film where electron density is sufficiently lowered can be obtained. Therefore, when a thin film transistor is formed by using the oxide membrane as an oxide semi-conductor film, stability becomes high, Vth shift caused by bias stress is inhibited, and thus operation as a thin film transistor becomes stable.

Vth means voltage during rising drain current when gate voltage (drain voltage) is applied. Vth shift means variation of Vth when gate voltage (drain voltage) is applied. If Vth shift is small, it can be said that the operation as a thin film transistor is stable.

Atom ratio of each element; Indium element (In), Gallium element (Ga), and Zinc element (Zn) is preferably in a range meeting the following formulae (1) to (3) so that an InGaO$_3$(ZnO) crystal structure can be readily formed, and balance among mobility, On-OFF ratio and S value becomes good during the forming of a thin film transistor.

$$0.20 \leq In/(In+Zn+Ga) \leq 0.60$$

$$0.10 \leq Ga/(In+Zn+Ga)$$

$$0.10 \leq Zn/(In+Zn+Ga)$$

wherein, "In," "Ga," and "Zn" are numbers of atoms for Indium element (In), Gallium element (Ga), and Zinc element (Zn), respectively.

If In/(In+Zn+Ga) is 0.2 or more, it is preferable since relative density is not lowered, and that mobility of a thin film transistor (TFT) obtained from the sputtering target is improved. If In/(In+Zn+Ga) is 0.6 or less, it is preferable since nodule is not appeared, and OFF current does not become higher.

If Ga/(In+Zn+Ga) is 0.10 or more, it is preferable since White spot is not appeared, and that OFF current during the preparation of a thin film transistor (TFT) obtained from the sputtering target does not become higher.

If Zn/(In+Zn+Ga) is 0.10 or more, it is preferable since White spot is not appeared, and that there is no influence when a thin film transistor (TFT) obtained from the sputtering target is prepared or when wet-etching is conducted.

More preferable atom ratio is $$0.25 \leq In/(In+Ga+Zn) \leq 0.55 \tag{1}$$

$$0.17 \leq Ga/(In+Ga+Zn) \leq 0.26 \tag{2}$$

$$0.21 \leq Zn/(In+Ga+Zn) \leq 0.60 \tag{3}, and$$

especially preferable atom ratio is $$0.34 \leq In/(In+Ga+Zn) \leq 0.50 \tag{1}$$

$$0.17 \leq Ga/(In+Ga+Zn) \leq 0.26 \tag{2}$$

$$0.24 \leq Zn/(In+Ga+Zn) \leq 0.49 \tag{3}.$$

(1-3) Relative Density

Relative density can be controlled by primary particle diameter or specific surface area of a crude powder; a method of preparing or drying a mixed powder; a forming method or a forming pressure during the preparation of a formed body; and sintering temperature, sintering time, rate of temperature increase, sintering atmosphere, pressure during sintering. Relative density of the sputtering target of the present invention is 95% or more, preferably 97% or more, and more preferably 99% or more. If relative density of a sputtering target is 95% or more, it is preferable since no abnormal electric discharge is occurred, and film forming rate is increased when sputtering is conducted.

The relative density is calculated from theoretical density calculated from density of a crude powder and density of a sintered body determined by Archimedes method.

(1-4) Average Particle Diameter of Crystals

The average particle diameter for each oxide crystal can be controlled by primary particle diameter or specific surface area of a crude powder; a method of preparing or drying a mixed powder; a forming method or a forming pressure during the preparation of a formed body; and sintering temperature, sintering time, rate of temperature increase, sintering atmosphere, pressure during sintering. The average particle diameter is preferably 20 μm or less, more specifically 10 μm or less, and especially preferably 5 μm or less. If the average particle diameter is 20 μm or less, it is preferable since abnormal electric discharge can be inhibited during sputtering. The average particle diameter is obtained from an average of the maximum particle diameter of each crystal particle determined by EPMA.

A half band width of the maximum peak (2θ=around 30.8 degree) of X-ray diffraction is preferably 0.1 to 2.0 degree, and more preferably 0.2 to 1.0 degree. 0.1 degree or more is preferable so that the average particle diameter becomes 20 μm or less. If a half band width of the maximum peak (2θ=around 30.8 degree) of X-ray diffraction is 2.0 degree or less, it is preferable since relative density becomes high and bulk resistance becomes low.

(1-5) Bulk Resistance

The bulk resistance can be controlled by primary particle diameter or specific surface area of a crude powder; a method of preparing or drying a mixed powder; a forming method or a forming pressure during the preparation of a formed body; and sintering temperature, sintering time, rate of temperature increase, sintering atmosphere, pressure during sintering. Bulk resistance is more preferably 0.1 to 10 mΩcm, and especially preferably 0.5 to 5 mΩcm. The bulk resistance is determined by four-point probe method using LORESTA (Mitsubishi chemical Co.), etc. If the bulk resistance is 20 mΩcm or less, it is preferable since abnormal electric discharge can be inhibited during sputtering.

(2) Method for Preparing a Sputtering Target

The sputtering target of the present invention is desirably prepared by the following steps.
(a) mixing a crude oxide powder (mixing step);
(b) forming the obtained mixture (forming step); and
(c) sintering the obtained formed body (sintering step).

In addition, the sputtering target of the present invention may be prepared by a method including the following essential steps and the following optional steps.
(a) an essential step for mixing a crude oxide powder composed of at least indium oxide, gallium oxide, and zinc oxide (mixing step);
(a)' an optional step for heating the obtained mixture at 500 to 1200° C. for 1 to 100 hours (calcining step);
(b) an essential step for forming the obtained mixture (forming step);
(c) an essential step for sintering the obtained formed body (sintering step);
(d) an optional step for reducing the sintered body obtained by the sintering step (reducing step); and
(e) an optional step for processing the sintered body to a configuration suitable for loading the body to a sputtering device (processing step).

(a) Mixing Step

Mixing step is an essential step for mixing metal oxides used as crude materials for a sputtering target.

Crude materials may comprise metal oxides such as oxides of Indium element (In), Gallium element (Ga), Zinc element (Zn) and a metal element (X) having positive four or more valences.

An average diameter of a zinc compound powder used as the crude material is preferably smaller than that of an indium compound powder. The average diameter of a metal oxide powder for the crude materials can be measured by a method described in JIS R 1619. Indium compounds include, for example, indium oxide and indium hydroxide. Zinc compounds include, for example, zinc oxide and zinc hydroxide. Oxide is preferable for each compound because of its ease of sintering or its rareness of remaining by-products.

Each of the above crude materials is mixed and ground by known mixing or grinding processes. Purity of each crude material is normally 99.9% (3N) or more, preferably 99.99% (4N) or more, further preferably 99.995% or more, and especially preferably 99.999% (5N) or more. If the purity of each crude material is 99.9% (3N) or more, properties of a semiconductor is not declined by impurities and thus credibility is sufficiently kept. Specifically, if Na content is less than 100 ppm, credibility at the time of making a thin-film transistor is preferably going up.

The above-mentioned crude oxide powder is mixed. The mixing is preferably conducted by using a normal mixing and grinding machine, for example, a wet-type ball mill, a beads mill or an ultrasonic device so as to mix and grind it uniformly. Average particle diameter of the mixture obtained after the mixing and grinding is usually 10 μm or less, preferably 1 to 9 μm, and especially preferably 1 to 6 μm. If the average particle diameter is 10 μm or less, density of a sputtering target to be obtained is preferably high. The average particle diameter can be determined by a method described in JIS R 1619.

Specific surface area of the crude oxide powder is, for example, 2 to 10 $m^2/g$, and preferably 4 to 8 $m^2/g$. The difference in the specific surface areas for each crude oxide powder is 5 $m^2/g$ or less, preferably 3 $m^2/g$. If the difference in the specific surface area is smaller, the crude oxide powder can be ground and mixed more efficiently, and especially, it is preferable that no gallium oxide particle is remained in an obtained oxide. In addition, it is preferable that the specific surface area for an indium oxide powder is substantially the same as that for a gallium oxide powder, so that the crude oxide powder can be ground and mixed more efficiently. In this connection, the specific surface area can be determined by, for example, BET method. It is preferable that the crude material is a mixed powder comprising an oxide indium powder, an oxide gallium powder, a zinc powder or a complex oxide powder having the specific surface area of 3 to 16 $m^2/g$ in which the specific area of the whole powders is 3 to 16 $m^2/g$. The specific surface area of each oxide powder is preferably almost the same as one another. This crude material makes grinding and mixing more effectively. Specifically, a ratio of the specific surface area is preferably in ¼ to 4 times, especially preferably in ½ to 2 times.

The mixed powder is mixed and ground by, for example, a wet-type medium agitating mill. In this connection, the mixed powder is preferably ground so that the specific surface area after the grinding is 1.0 to 3.0 $m^2/g$ higher than that of the crude mixed powder, or so that an average median diameter (d50) after the grinding is around 0.8 to 2 μm. An oxide indium powder, an oxide gallium powder, a zinc powder or a complex oxide powder thereof can be used for a crude material. By using such a crude powder controlled by the above, an oxide sintered body having a high density can be obtained without any calcining step. A reducing step becomes also unnecessary.

It is preferable that increase in the specific surface area of the above-mentioned crude mixed powder is 1.0 m$^2$/g or more, or that the average median diameter (d50) after grinding the crude mixed powder is 1 μm or less, since sintered density is sufficiently high. It is also preferable that increase in the specific surface area of the crude mixed powder is 3.0 m$^2$/g or less, or that the average median diameter (d50) after grinding the crude mixed powder is 0.6 μm or more, since contamination (the amount of impurity contaminated) from grind devices during grinding is not increase.

The value of the specific surface area for each powder is determined by BET method. The value of the median diameter (d50) of grain size distribution for each powder is determined by a grain size distribution meter. These values can be controlled by grinding the powder using a dry-type grinding method or a wet-type grinding method.

The variation range of distribution of the mixed powder of Ga and In after grinding is preferably within 0.5%. Further, the variation range of density after grinding is preferably within 3%.

During the mixing and grinding, water or ethanol containing about 1 vol. % of polyvinyl alcohol (PVA) may be used as a medium.

Median diameter (d50) of the crude oxide powder is, for example, 0.5 to 20 μm, and preferably 1 to 10 μm. The median diameter (d50) of the crude oxide powder is preferably 0.5μ or more so that sintered density is not reduced so as not to make any air vessels in a sintered body. The median diameter (d50) of the crude oxide powder is preferably 20 μm or less so that particle diameter of the sintered body is not increased.

If at least a part of a crude oxide powder composed of indium oxide, gallium oxide and zinc oxide is a composite oxide of a powder of a InGaO$_3$(ZnO) crystal, it is preferable since wide variety of composition or sintering condition capable of preparing a target comprising InGaO$_3$(ZnO) can be used.

(a)' Calcining step

A method for preparing a sputtering target of the present invention may contain (a)' step for calcining the obtained mixture after the step (a).

In this calcining step, the mixture obtained by the above-mentioned (a) step is calcined. By the calcining, density of a sputtering target obtained at the end can be readily increased. The calcining step may or may not be conducted, but if the calcining step is not conducted, it is preferable since steps are reduced drastically, and difference in composition between charged amount and a target is reduced.

If the calcining step is not conducted, the specific surface area of an indium oxide is preferably 6 to 10 m$^2$/g, the specific surface area of a gallium oxide is preferably 5 to 10 m$^2$/g, and the specific surface area of a zinc oxide is preferably 2 to 4 m$^2$/g. If the specific surface area is in the above ranges, efficiency of mixing and grinding becomes higher, and then steps are reduced drastically.

The mixture obtained by (a) step is desirably heated at 500 to 1400° C., preferably at 800 to 1200° C., for 1 to 100 hours, and preferably for 2 to 50 hours at the calcining step. Such a heating condition at 500° C. or more for 1 hour or more is desirable, since thermal decomposition of an indium compound, a zinc compound and a tin compound is sufficiently conducted. A heating condition at 1200° C. or less for 100 hours or less is also desirable, since sublimation of zinc is inhibited and particles rarely create a bulk.

The obtained post-calcined mixture is preferably ground before the following forming step and the sintering step. This grinding of the post-calcined mixture is preferably conducted by a ball mill, a roll mill, a palm mill, or a jet mill. Average particle diameter of the post-calcined mixture after the grinding is, for example, 0.01 to 3.0 μm, and preferably 0.1 to 2.0 μm. It is preferable that the average particle diameter of the post-calcined mixture is 0.01 μm or higher, since sufficient bulk specific gravity is retained, and it is easy to handling it. It is also preferable that the average particle diameter of the post-calcined mixture is 1.0 μm or less, since density of a sputtering target obtained at the end can be readily increased.

The average particle diameter of the post-calcined mixture can be determined by a method described in JIS R 1619.

(b) Forming Step

The forming step is a step of press forming the mixture of metal oxides (or the post-calcined mixture if the above calcining step is present) so as to make a formed body. By this step, the mixture (or post-calcined mixture) is formed in a configuration appropriate for a sputtering target. If there is a calcining step, micro powders of the obtained post-calcined mixture may be granulated and then formed in a desirable configuration by a press forming.

Forming processing which can be used in the present invention includes, for example, uniaxial compression, metal molding, casting forming, injection molding, and so on. In order to obtain a sintered body (a sputtering target) having high sintered density, forming by cold isostatic press (CIP) is preferable.

During the forming processing, a forming auxiliary agent such as polyvinyl alcohol, methyl cellulose, polywax, or oleic acid may be used.

The press forming may be conducted by well-known forming methods such as Cold Press method and Hot Press method. The press forming is conducted, for example, by filling an obtained mixed powder in a metal mold and press forming it by a Cold Press device. The press forming is also conducted at ambient temperature (25° C.), under 100 to 100000 kg/cm$^2$, and preferably 500 to 10000 kg/cm$^2$.

As for temperature profile, rate of temperature increase up to 1000° C. is preferably 30° C./hour or more, and rate of temperature decrease for cooling is preferably 30° C./hour or more. If the rate of temperature increase is 30° C./hour or more, decomposition of oxides does not progress, and no pinhole is appeared. If the rate of temperature decrease for cooling is 30° C./hour or more, the composition ratio of In or Ga does not change.

The Cold Press method and Hot Press method are explained in detail below. By the Cold Press method, a mixed powder is filled in a forming die to prepare a formed body and then the body is sintered. By Hot Press method, a mixed powder is directly sintered within a forming die.

As for the Cold Press method of the dry-processes, a crude material obtained after a grinding step is dried by a spray dryer and so on, and then formed. The forming may be conducted by methods known in the art, for example, press forming, cold isostatic press, metal molding, casting forming, or injection molding. In order to obtain a sintered body (a sputtering target) having high sintered density, the forming is preferably conducted by a method accompany with cold isostatic press (CIP). During the forming processing, a forming auxiliary agent such as polyvinyl alcohol, methyl cellulose, polywax, or oleic acid may be used.

A filtering forming method (see Japanese published unexamined application No. 11-286002) is preferably used as the above-mentioned wet-processes. This filtering forming method uses a filtering forming die comprising a water-insoluble material which is used for obtaining a formed body by vacuum-pumping water out from ceramic crude material slurry. The body comprises a lower forming die having one or more drain holes, a filter having water flowable property in which filter is placed on the lower forming die, and a forming die flame which clips the filter from the upper side through a seal material for sealing it. Each of the lower forming die, the forming die flame, the sealing material and the filter is disassemblably structured. By using the filtering forming die which vacuum-pumps water in the slurry out only from the filter side, slurry containing mixed powder, ion-exchange water and an organic additive is prepared. This slurry is injected in the filtering forming die, and then a formed body is prepared by vacuum-pumping water in the slurry out only from the filter side. After the obtained ceramic formed body is dry-delipidated, the body is sintered.

(c) Sintering Step

Sintering step is a step of sintering the formed body obtained by the above forming step.

Normal pressure sintering or high temperature and compressed sintering is preferable.

Conditions of the sintering step are preferably sintering under oxygen gas atmosphere, under ambient or compressed pressure. When a large target is prepared, normal pressure sintering is especially preferable so that even large target is easily prepared uniformly. Sintering is preferably conducted under oxygen atmosphere by flowing oxygen or under compressed pressure. Under these conditions, zinc transpiration is inhibited, and a sintered body having no void (cavity) can be obtained. White-spot (decolorization), which is caused by the presence of in-plane or perpendicular composition distribution in a target, can be inhibited.

Oxygen atmosphere can be made by atmosphere, by a mix gases comprising oxygen, or by compressed oxygen. Control of the atmosphere is preferably conducted by flowing a gas. If sintering is conducted under the atmosphere containing oxygen, it is preferable that difference in oxygen defect amount between the surface and inside of the target becomes reduced.

The sintering is preferably conducted usually at 1230 to 1350° C., and preferably 1250 to 1340° C., usually for 3 to 60 hours, preferably 3.5 to 48 hours, and more preferably 4 to 30 hours; or at 1350 to 1450° C., and preferably 1360 to 1440° C., usually for 0.5 to 8 hours, preferably 1 to 6 hours, and more preferably 2 to 5 hours. If the sintering temperature is 1230 to 1350° C. and sintering time is 3 to 60 hours, it is preferable since density of a sputtering target can easily be raised and an $InGaO_3(ZnO)$ crystal phase can easily be formed. If the sintering temperature is 1350 to 1450° C. and sintering time is 0.5 hour or more, or if the sintering temperature is 1350 to 1450° C. and sintering time is 0.5 to 8 hours, it is preferable since a crystal phase other than $InGaO_3(ZnO)$ can be formed.

When the sintering is conducted under oxygen gas atmosphere or oxygen gas atmosphere, density of a sputtering target is readily increased and appearance of abnormal discharge is preferably inhibited during sputtering. The oxygen gas atmosphere is an atmosphere where oxygen concentration is, for example, 10 to 1000%. The sintering can be conducted under ambient or compressed pressure. The compression is desirably, for example, 98000 to 1000000 Pa, and preferably 100000 to 500000 Pa.

Rate of temperature increase at the sintering is usually 20° C./min. or less, preferably 8° C./min. or less, more preferably 4° C./min. or less, further preferably 2° C./min. or less, and especially preferably 0.5° C./min. or less. If the rate is 20° C./min. or less, homologous crystal is sufficiently formed.

By sintering a formed body of a mixture of an oxide containing a complex oxide, a peak between $2\theta=62$ degree and 63 degree, which does not belong to a pattern indicating a crystal structure of $InGaO_3(ZnO)$, can be 5% or less of the maximum peak of $InGaO_3(ZnO)$ (usually in around $2\theta=30.8$ degree). The complex oxide includes an $InGaO_3(ZnO)$ crystal, an $In_2Ga_2ZnO_7$ crystal, an $InGaO_3$ crystal, an $In_2O_3(ZnO)_2$ crystal, an $In_2O_3(ZnO)_3$ crystal, an $ZnGa_2O_4$ crystal, etc. An $InGaO_3(ZnO)$ crystal, which indicates a homologous structure, is especially preferable.

Atom ratio of In, Ga, and Zn other than oxide in a sputtering target preferably meets $Ga/(In+Zn+Ga)<In/(In+Zn+Ga)$. Further, atom ratio of In, Ga, and Zn other than oxide in a sputtering target preferably meets the following formulae.

$0.51 \leq In/(In+Ga) \leq 0.86$ $0.20 \leq In/(In+Zn+Ga) \leq 0.60$ $0.10 \leq Ga/(In+Zn+Ga) \leq 0.45.$ It is preferable to meet the following formula.

$0.53 \leq In/(In+Ga) \leq 0.72$

It is preferable to meet the following formula.

$0.59 \leq In/(In+Ga) \leq 0.63$

It is preferable to meet the following formula.

$0.34 \leq In/(In+Zn+Ga) \leq 0.50$

It is preferable to meet the following formula.

$0.16 \leq In/(In+Zn+Ga) \leq 0.40$

It is preferable to meet the following formula.

$0.17 \leq In/(In+Zn+Ga) \leq 0.26$

It is preferable to meet the following formula.

$0.30 \leq In/(In+Zn+Ga) \leq 0.43$

If Zn is 0.10 or more, it is preferable since a crystal phase such as $InGaO_3$ or $Ga_2O_3$ will not deposit. If Zn is 0.70 or less, it is preferable since a ZnO crystal phase will not deposit.

If $In/(In+Ga)$ is 0.51 or more, it is preferable since a Ga-rich phase such as $ZnGa_2O_4$ phase or $Ga_2O_3$ phase will not be appeared, difference in composition ratio between a sputtering target and a semi-conductor film is reduced, and abnormal discharge is inhibited. When a thin film transistor was prepared, it is preferable since mobility is raised, S value can be reduced and enlarged, and ON-OFF ratio become increased. If $In/(In+Ga)$ is 0.53 or more, it is preferable since a peak between $2\theta=62$ degree and 63 degree is disappeared, uniformity in bulk resistance of a target, variation of film-forming rate, and reproducibility (ratio of mobility) and uniformity during the production of a thin film transistor are improved. If $In/(In+Ga)$ is 0.86 or less, a In-rich phase such as $In_2O_3$ phase will not be appeared, difference in composition ratio between a sputtering target and a semi-conductor film is reduced and increased, creation of nodules are inhibited during a sputtering, and properties such as mobility, S value and ON-OFF ratio become less reliable to the thickness of a semi-conductor film.

If $In/(In+Ga)$ is 0.20 or more, it is preferable since mobility is increased during the production of a thin film transistor. If $In/(In+Ga)$ is 0.60 or more, it is preferable since ON-OFF current becomes lower and ON-OFF ratio may become reduce during the production of a thin film transistor.

If $Ga/(In+Zn+Ga)$ is 0.10 or more, it is preferable that a crystal form other than a homologous structure is formed, and properties such as mobility, S value and ON-OFF ratio become less reliable to the thickness of a semi-conductor film. If Ga/(In+Zn+Ga) is 0.45 or less, it is preferable that mobility becomes increased, S value becomes reduced, and ON-OFF ratio becomes increased. The contents of In, Ga, and Zn in a sputtering target can be analyzed by ICP, etc.

A method for forming a complex oxide powder includes a discharge plasma sintering method (SPS) in which current is applied to a powder while the powder is formed with a pressure (pressure forming), a hot press method in which a powder is treated at high temperature while the powder is formed with a pressure (pressure forming).

Especially, using a discharge plasma sintering as a sintering method with pressure-forming a composite oxide powder is preferable so that a sputtering target can be obtained by keeping a crystal form of a formed body. The discharge plasma sintering is conducted, for example, with a powder press-formed, by applying a current of 100 to 1000 A/cm$^2$ for 5 min. to 1 hour.

(d) Reducing Step

Reducing step is also preferably contained so that bulk resistance of the obtained sintered body is unified as a whole oxide. The reducing step is an optional step for conducting reducing process so as to uniformize bulk resistance of the sintered body obtained by the sintering step as a whole target. By conducting a reducing treatment at 300 to 1200° C. within vacuum, or inert atmosphere such as argon or nitrogen, oxygen defects are appeared in a sintered body (oxygen content is reduced rather than stoichiometric quantities), and bulk resistance of a sputtering target can be lowered, and thus it is preferable.

Reducing methods applicable to the present steps include, for example, a method for circulating a reducing gas, a method for sintering it in vacuum, and a method for sintering it in an inert gas.

The reducing gas may include, for example, hydrogen, methane, carbon monoxide, or a mixed gas containing these gases and oxygen.

The inert gas may include nitrogen, argon, or a mixed gas containing these gases and oxygen.

Temperature at the reducing step is usually 100 to 800° C., and preferably 200 to 800° C. Time period for the reducing process is usually 0.01 to 10 hours, preferably 0.05 to 5 hours.

Pressure of the reducing gas or the inert gas is, for example, 9800 to 1000000 Pa, preferably 98000 to 500000 Pa. When the sintering is conducted in vacuum, the vacuum specifically means around $10^{-1}$ to $10^{-8}$ Pa, preferably $10^{-2}$ to $10^{-5}$ Pa, and a residual gas may be argon, nitrogen, etc.

(e) Processing Step

The obtained oxide is optionally processed.

Processing step is an optional step of cutting processing a sintered body obtained as the above sintering in an appropriate form so as to attach a sputtering device, and loading an attaching device such as backing plates. Thickness of a sputtering target is usually 2 to 20 mm, preferably 3 to 12 mm, especially preferably 4 to 6 mm. The surface of a sputtering target is preferably finished by #200 to 10,000 of a diamond whetstone, and especially preferably finished by #400 to 5,000 of a diamond whetstone. If #200 to 10,000 of diamond whetstone is used, it is preferable that the oxide does not break up.

After processing the oxide to form a sputtering target, it was then bonded on a backing plate (support), a sputtering target which can be used for loading it to a film-forming device is prepared. The backing plate is preferably made by oxygen free copper. An indium solder is preferably used for the bonding.

Plural of sputtering targets are loaded to one backing plate so as to be used as substantially one sputtering target.

(3) Method for Producing a Thin Film (3-1) Forming of an Amorphous Oxide Thin Film By using a sputtering target of the present invention, an amorphous oxide thin film can be formed on a substrate by a sputtering method or by conducting post-heating process such as heat treatment. Specifically, a step of (i) conducting sputtering using the sputtering target of the present invention under 25 to 450° C. of a film forming temperature is included. By this step, an amorphous oxide thin film having less than $1 \times 10^{18}$/cm$^3$ of an electric carrier concentration can be obtained.

The sputtering method may include a DC (direct current) sputter method, an AC (alternating current) sputter method, an RF (radio frequency) sputter method, a magnetron sputter method, an electron beam vapor deposition method, an ion plating method, etc. The DC (direct current) sputter method and the RF (radio frequency) sputter method are preferably used.

The film forming temperature during sputtering may differ based on sputtering methods, but for example 25 to 450° C., preferably 30 to 250° C., and more preferably 35 to 150° C. are desirable. The film forming temperature is a temperature of a substrate where a thin film is formed.

Pressure in a sputtering chamber at sputtering may differ based on sputtering methods, but for example, when a DC (direct current) sputter method is used, 0.1 to 2.0 MPa, and preferably 0.3 to 0.8 MPa are desirable. When an RF (radio frequency) sputter method is used, 0.1 to 2.0 MPa, and preferably 0.3 to 0.8 MPa are desirable.

Electric power output supplied at sputtering may differ based on sputtering methods, but for example, when a DC (direct current) sputter method is used, 10 to 1000 W, and preferably 100 to 300 W are desirable. When an RF (radio frequency) sputter method is used, 10 to 1000 W, and preferably 50 to 250 W are desirable.

Power supply frequency during the RF (radio frequency) sputter method, for example 50 Hz to 50 MHz, and preferably 10 k to 20 MHz are desirable.

A carrier gas at the sputtering may differ based on sputtering methods, but for example, oxygen, helium, argon, xenon, and krypton are included. A mixed gas of argon and oxygen is preferable. When the mixed gas of argon and oxygen is used, flow ratio of argon:oxygen of Ar:O$_2$=100 to 80:0 to 20, and preferably 99.5 to 90:0.5 to 10 are desirable.

Prior to a sputtering, a sputtering target is adhered (bonding) on a support. This is for fixing a target to a sputtering device.

Sputtering is carried out using the bonded sputtering target to obtain an amorphous oxide thin film containing In, Ga and Zn oxides as major ingredients on a substrate. The "major ingredients" means that 60% or more in atom ratio of each of In, Ga and Zn elements is contained when total atom ratio of elements other than oxygen is 100 atom %.

Glass or resin (PET, PES, etc.) can be used as the substrate.

Film thickness of the obtained amorphous oxide thin film may differ based on film forming time or sputtering methods, but the thickness is for example, 5 to 300 nm, and preferably 10 to 90 nm.

Electric carrier density of the obtained amorphous oxide thin film is, for example, less than $1 \times 10^{18}$/cm$^3$, and preferably $5 \times 10^{17}$ to $1 \times 10^{12}$/cm$^3$. The carrier density may be adjusted by a heat treating method under various environments.

Relative density of the obtained amorphous oxide thin film is desirably 6.0 g/cm$^3$ or more, and preferably 6.1 to 7.2 g/cm$^3$. If the thin film has such high density, the obtained oxide thin film has less creation of nodules or particles, and then an oxide thin film having excellent film properties may be obtained.

In addition, specific resistance of the obtained amorphous oxide thin film is preferably 10$^{-1}$ to 10$^8$ Ωcm, and more preferably 1 to 10$^6$ Ωcm. The specific resistance of the obtained amorphous oxide thin film can be adjusted by partial pressure for oxygen at the film-forming, when direct forming is conducted by using a sputtering film-forming. When forming is conducted via heat treatment, the adjustment can be done by atmosphere, temperature or time during the heat treatment. When the heat treatment is conducted after forming of a protective film, the adjustment can be conducted based on the composition of the protective film.

Variation (%) of content ratio of In and Ga is preferably 10% or less, more preferably 5% or less, and especially preferably 2% or less.

If it is more than 10%, properties of a thin film transistor is changed when a film is formed for a long time (reproducibility is lowered), film forming speed may be changed during continuous film forming.

Variation (%) of content ratio of In and Ga is obtained from the following formula (absolute value is used).

$$\text{Variation (\%) of content ratio of In and Ga} = ((\text{In}/(\text{In}+\text{Ga}) \text{ of a semi-conductor film}) - (\text{In}/(\text{In}+\text{Ga}) \text{ of a target}))/(\text{In}/(\text{In}+\text{Ga}) \text{ of a target}) \times 100(\%)$$

Further, by using the sputtering target of the present invention, partial pressure for oxygen at the film-forming may be reduced, and a transparent conductive film can be obtained by conducting reduction treatment on the obtained film.

A crystal oxide film can also be obtained by conducting crystallization treatment such as a treatment at a high temperature of 600° C. or more.

(3-2) Manufacturing a Thin Film Transistor

When a thin film transistor comprising the amorphous oxide thin film of the present invention and an oxide insulation layer is made, the following steps are appropriately included.

(i) heat treating an amorphous oxide thin film of the present invention within oxidation atmosphere; and (ii) forming an oxide insulation layer on the heat treated amorphous oxide thin film.

In this connection, the heat treating is desirably conducted, for example, at 100 to 450° C., and preferably 150 to 350° C. for 0.1 to 10 hours, and preferably 0.5 to 2 hours in view of stability of semi-conductor properties.

The method of forming an oxide insulation layer on the heat treated amorphous oxide thin film may include a CVD method or a sputter method.

The oxide insulation layer may include, for example, $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $SC_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiN_x$, $Al_2O_3$, $Y_2O_3$, $Hf_2O_3$, and $CaHfO_3$ are preferable, $SiO_2$, $SiN_x$, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as $SiO_x$ are allowed). $SiN_x$ may contain hydrogen element.

A laminated structure containing two or more of insulation films is also applicable.

Although a crystalline material, a multi-crystalline material or an amorphous material may be used, a multi-crystalline material or an amorphous material each of which is readily produced is preferable. It is especially preferable that a protective layer is an amorphous material. If a protective layer is an amorphous material, interfacial smoothness is improved, high carrier mobility is kept, and neither threshold voltage nor S value becomes too high.

The S value (Swing Factor) is a value for indicating steepness of drain current which rises rapidly from OFF position to ON position when gate voltage is increased from Off position. As defined by the following formula, increment of gate voltage when drain current increases single digit (10 times) is S value.

$$S \text{ value} = dVg/d\log(Ids)$$

Lower S value means high steepness in rising (cf. Yasuhiro Ukai, "Hakumaku-trangista gijutu no subete (All about Thin Film Transistor Technique)", Kogyo Chosa Kai, 2007). If S value is high, high gate voltage is required for switching from ON to OFF, and then there is possibility that electric power consumption becomes high.

S value is preferably 0.8V/dec or less, more preferably 0.3V/dec or less, further preferably 0.25V/dec or less, and especially preferably 0.2V/dec or less. If S value is more than 0.8V/dec, there is possibility that driving voltage becomes high and then electric power consumption also becomes high. Especially, when the thin film transistor is used for an organic light emitting display, because of direct current drive, S value is preferably 0.3V/dec or less so as to enormously reduce electric power consumption.

(3-3) Specific Making Method of a Thin Film Transistor

A substrate such as a grass substrate is prepared, and then Ti having thickness of 1 to 100 nm (a contact layer), Au having thickness of 10 to 300 nm (a connecting layer), and Ti having thickness of 1 to 100 nm (a contact layer) are laminated in this order. The laminated layers are formed a gate electrode by a photo-lithography method and a lift-off method.

$SiO_2$ film having thickness of 50 to 500 nm is formed on the laminated layers by a TEOS-CVD method, and then a gate insulation film is formed. A film forming method for a gate insulation film may be a sputter method, but a CVD method such as a TEOS-CVD method or a PECVD method is preferable.

A sputtering target composed of the oxide of the present invention is used as a target, and then an amorphous oxide thin film (semi-conductor) composed of In—Ga—Zn—O oxide having thickness of 5 to 300 nm is deposited as a channel layer by a RF sputter method. An element on which the obtained thin film is deposited is cut into an appropriate size, and then heat treatment is conducted under ambient pressure at 100 to 450° C. for 6 to 600 minutes. The obtained element is further laminated by Ti having thickness of 1 to 100 nm (a contact layer), Au having thickness of 10 to 300 nm (a connecting layer), and Ti having thickness of 1 to 100 nm (a contact layer) in this order to form a source electrode and a drain electrode by a photo-lithography method and a lift-off method. $SiO_2$ film having thickness of 50 to 500 nm is further formed on the laminated layers by a sputter method as a protective film. A method for film-forming a protective film may be a CVD method. In this connection, by changing order of steps, making of a protective film (etching stopper) may be conducted prior to the preparation of the above source electrode and drain electrode.

Heat treatment of 150 to 350° C. for 5 minutes to 5 hours is preferably added after the preparation of the protective film (etching stopper). By adding the heat treatment, the surface of a semi-conductor which is reduced at the time of film forming of the protective film is oxidized, and thus OFF current can be reduced.

(4) Utility of the Thin Film

The amorphous oxide thin film obtained above may be used as-is, or by heating treatment, used as a thin film transistor, a channel layer for a thin film transistor, or a semi-conductor film of a solar cell or a gas sensor. In addition, this film can be used for an electrode as a conductive film by reducing resistance via reduction treatment.

(4-1) The thin film transistor prepared by the present invention is explained below. The thin film transistor includes a substrate, a semi-conductor layer, a protective layer for a semi-conductor layer, a gate insulation film or an electrode.

Substrate

As for a substrate, any substrate known in the present technical field may be used without limitation. For example, a glass substrate such as alkaline silicate type glass, alkali-free glass, or quartz glass; a silicon substrate; a resin substrate such as acryl, polycarbonate, or polyethylene naphthalate (PEN); or a polymer film base material such as polyethylene terephthalate (PET) or polyamide can be used. Thickness of substrate or base material is usually 0.1 to 10 mm, preferably 0.3 to 5 mm. If a grass substrate is used, a chemically or thermally enhanced grass substrate is preferable. If transparency or smoothness is required, a glass substrate and a resin substrate are preferable, and a glass substrate is especially preferable. If weight saving is required, a resin substrate or a polymer base material is preferable.

Semi-Conductor Layer

A semi-conductor layer includes a composite oxide of In (indium), Zn (zinc), and Ga (gallium). Such a semi-conductor layer can be prepared, for example, by forming a thin film using a sputtering target of the present invention (a target for a semi-conductor).

In the present invention, the semi-conductor layer is preferably an amorphous film. By using such an amorphous film, its contact property to an insulation film or a protective layer has improved, and then uniform transistor property can be easily obtained even if it is large area. Whether or not the semi-conductor layer is an amorphous film can be confirmed by X-ray crystal structure analysis. If no clear peak is monitored, the semi-conductor layer is amorphous.

Carrier density of the semi-conductor layer is preferably $10^{13}$ to $10^{18}/cm^3$, and especially preferably $10^{14}$ to $10^{17}/cm^3$. If carrier density is in the above range, the semi-conductor layer becomes readily a non-degeneration semi-conductor, and then balance between mobility and ON-OFF ratio is preferably improved when it is used as a transistor. Band gap is preferably 2.0 to 6.0 eV, and more preferably 2.8 to 5.0 eV. If the band gap is 2.0 eV or more, a field effect type transistor causes less improper operation by absorbing visible light. If the band gap is 6.0 eV or less, a field effect type transistor rarely lose its function by less supplement of carrier.

A semi-conductor layer is preferably a non-degeneration semi-conductor having thermal active property. If a non-degeneration semi-conductor is used, some disadvantages such as off-current and gate-leak current increase caused by excess of carrier, or normally-ON caused by negative threshold can be avoided. Whether or not the semi-conductor layer is a non-degeneration semi-conductor can be confirmed by measuring mobility and carrier density as a result of temperature changes using Hall effect. In order to make a semi-conductor layer being a non-degeneration semi-conductor, partial pressure for oxygen during preparing a film is adjusted, and carrier density is optimized by post treatment for controlling the number of oxygen defects.

Surface roughness of the semi-conductor layer (RMS) is preferably 1 nm or less, more preferably 0.6 nm or less, and especially preferably 0.3 nm or less. If RMS is 1 nm or less, mobility would not be reduced.

The semi-conductor layer is preferably an amorphous film maintaining at least a part of an edge-sharing structure in a bixbite structure of indium oxide. Whether the amorphous film containing indium oxide maintains at least a part of an edge-sharing structure in a bixbite structure of indium oxide may be confirmed by radial distribution function (RDF) obtained by Grazing Incidence X-ray Scattering (GIXS) in which a peak showing In—X (X is In or Zn) is in 0.3 to 0.36 nm (specifically, see F. Utsuno, et al., Thin Solid Films, Volume 496, 2006, pp. 95-98).

Assuming that the maximum value of RDF where atomic distance is between 0.30 and 0.36 nm is A, and that the maximum value of RDF where atomic distance is between 0.36 and 0.42 is B, A/B>0.7 is preferable, A/B>0.85 is more preferable, A/B>1 is further preferable, and A/B>1.2 is especially preferable.

If A/B is 0.7 or more, mobility is rarely reduced, and threshold or S value is rarely increased too high. Small A/B seems to reflect poor short distance orderliness in an amorphous film.

Average bond distance of In—In is preferably 0.3 to 0.322 nm, and especially preferably 0.31 to 0.32 nm. Average bond distance of In—In can be measured by X-ray absorption spectroscopy. The measurement by the X-ray absorption spectroscopy shows extended X-ray absorption fine structure (EXAFS) expanded from rising to a high energy portion such as several hundred eV higher. EXAFS is caused by backscattering of electrons by atoms surrounding excited atoms. Interference effect between releasing electron wave and backscattered wave is occurred. The interference depends on wavelength of electron state, and light path length traversing between surrounding excited atoms. Radial distribution function (RDF) is obtained by conducting Fourier transform of EXAFS. Average bond distance can be estimated from RDF peak.

Film thickness of the semi-conductor layer is normally 0.5 to 500 nm, preferably 1 to 150 nm, more preferably 3 to 80 nm, and especially preferably 10 to 60 nm. If the thickness is 0.5 nm or more, industrial, uniform film forming is possible. If the thickness is 500 nm or less, film forming time is not too long. If the thickness is between 3 and 80 nm, TFT properties such as mobility or ON-OFF ratio are especially improved.

Preferred embodiment of the present invention is that the semi-conductor layer is an amorphous film, and that energy width ($E_0$) of delocalized level is 14 meV or less. The energy width ($E_0$) of delocalized level of the semi-conductor layer is preferably 10 meV or less, more preferably 8 meV, and especially preferably 6 meV. If the energy width ($E_0$) of delocalized level is 14 meV or less, and if the semi-conductor layer is used as an active layer for a transistor, mobility is rarely reduced, and threshold or S value is rarely increased too high. High energy width ($E_0$) of delocalized level of the semi-conductor layer seems to reflect poor short distance orderliness in an amorphous film.

Semi-Conductor Layer

The thin film transistor preferably has a protective layer of a semi-conductor. If there is a protective layer of a semi-conductor, oxygen in a surface layer of a semi-conductor is not left even under vacuum or low pressure, off-current is not increased, and threshold voltage does not become negative. There is no environmental effect such as humidity even under atmospheric pressure, and there is no risk of increasing variation in transistor properties such as threshold voltage.

There is no limitation for selecting material to form the protective layer of a semi-conductor. Any material commonly used may be chosen unless feature of the present invention is lost. For example, $SiO_2$, $SiNx$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiNx$, $Al_2O_3$, $Y_2O_3$, $Hf_2O_3$, and $CaHfO_3$ are preferably used; $SiO_2$, $SiNx$, $Y_2O_3$, $Hf_2O_3$, and $CaHfO_3$ are more preferable; $SiO_2$, $Y_2O_3$, $Hf_2O_3$, and $CaHfO_3$ are especially preferable. Number of oxygen in these oxides does not always have to correspond to stoichiometric ratio (e.g. $SiO_2$ as well as $SiOx$ are allowed). When a protective layer is film-formed from an oxide, partial pressure for oxygen is preferably $1 \times 10^{-2}$ Pa or more so as to reduce OFF current. Heat history between 150 and 350° C. is preferably applied for reducing oxygen defects on a semi-conductor layer and the surface of a protective film, and for reducing OFF current. $SiOx$ may contain hydrogen element.

Such a protective film may have a laminated structure containing two or more different kinds of insulation film. The protective film may be a crystalline material, a multi-crystalline material or an amorphous material. A multi-crystalline material or an amorphous material each of which is readily, industrially produced is preferable. It is especially preferable that the protective layer is an amorphous material. If a protective layer is an amorphous material, interfacial smoothness is improved, mobility is not lowered, and neither threshold voltage nor S value becomes too high.

The protective layer of a semi-conductor layer is preferably an amorphous oxide or an amorphous nitride, and an amorphous oxide is especially preferable. If the protective layer is an amorphous oxide, oxygen in a semi-conductor does not transfer to a protective layer side, OFF current does not become high, and there is no risk to show normally-OFF caused by negative threshold voltage. The protective layer of the semi-conductor layer may use an organic insulation film such as poly-(4-vinylphenol) (PVP), or parylene. The protective layer of the semi-conductor layer may have two or more layer-laminated structure including an inorganic insulation film and an organic insulation film.

Gate Insulation Film

There is no limitation for selecting material to form the gate insulation film. Any material commonly used may be chosen unless feature of the invention related to the present embodiment is lost. For example, $SiO_2$, $SiNx$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, etc. Among these oxides, $SiO_2$, $SiNx$, $Al_2O_3$, $Y_2O_3$, $Hf_2O_3$, and $CaHfO_3$ are preferably used; $SiO_2$, $SiNx$, $Y_2O_3$, $Hf_2O_3$, and $CaHfO_3$ are more preferable. Number of oxygen in these oxides does not always have to correspond to stoichiometric ratio (e.g. $SiO_2$ as well as $SiOx$ are allowed). $SiOx$ may contain hydrogen element.

Such a gate insulation film may have a laminated structure containing two or more different kinds of insulation film. The gate insulation film may be a crystalline material, a multi-crystalline material or an amorphous material. A multi-crystalline material or an amorphous material each of which is readily, industrially produced is preferable. The gate insulation film may use an organic insulation film such as poly-(4-vinylphenol) (PVP), or parylene. The gate insulation film may have two or more layer-laminated structure including an inorganic insulation film and an organic insulation film.

Electrode

There is no limitation for selecting material to form each electrode such as a gate electrode, a source electrode, and a drain electrode. Any material commonly used may be chosen unless feature of the present invention is lost.

For example, the material includes a transparent electrode such as indium tin oxide (ITO), indium zinc oxide, ZnO, or $SnO_2$; a metal electrode such as Al, Ag, Cr, Ni, Mo, Au, Ti, Ta, or Cu; or an alloyed metal electrode contained thereof. These materials are preferably laminated two or more layers to reduce contact resistance, and to enhance interface strength. In order to reduce contact resistance of a source electrode and a drain electrode, the interface between them and an electrode of a semi-conductor may be subject to plasma treatment and ozone treatment so as to control their resistance.

(4-2) Method for Making a Thin Film Transistor (A Field Effect Type Transistor)

The making method of the present invention is characterized by using the sputtering target of the above-mentioned present invention, and by comprising a step for forming an amorphous oxide thin film (semi-conductor layer) and a step for heat-treating it at 70 to 350° C. after forming the amorphous oxide thin film.

In this connection, each contractual element (layer) of the above-mentioned thin film transistor may be formed by any method known in the present technical field.

Specifically, a film forming method includes a chemical film forming method such as a spray method, a dip method, or a CVD method; and a physical film forming method such as a sputter method, a vacuum deposition method, an ion plating method, or a pulse laser deposition method. A physical film forming method is preferable, since carrier density is readily controlled and film quality is easily improved. A sputter method is more preferable because of its high productivity.

Sputtering includes a method using a sintered target of a composite oxide, a method using a cosputter by multiple sintered targets, and a method using a reactive sputter by an alloy target. A sintered target of a composite oxide is preferably used. RF, DC or AC sputtering known in the art is also useful. DC or AC sputtering is preferable in view of uniformity and mass productivity (facility costs).

The formed film may be subject to patterning by several etching methods.

In the present invention, a semi-conductive film is preferably formed using the target of the present invention by DC or AC sputtering. By using DC or AC sputtering, damage at the film forming can be reduced in comparison with an RF sputtering. Therefore, in a case with a field effect type transistor, reduction of threshold voltage shift, enhancement of mobility, reduction of threshold voltage, reduction of S value and so on can be expected.

In the present invention, heat treatment is preferably conducted at 70 to 350° C. after film forming of a semi-conductor layer. Especially, the heat treatment is preferably conducted at 70 to 350° C. after forming a semi-conductor layer and a protective layer of the semi-conductor layer. If the temperature is 70° C. or more, the obtained transistor may keep its sufficient heat stability, heat resistance, and sufficient mobility, and there is no rick to become S value or threshold voltage too high. If the temperature is 350° C. or less, a substrate having no heat resistance can be used, and facility cost for heat treatment is not necessary.

Heat treating temperature is more preferably 80 to 260° C., further preferably 90 to 180° C., and especially preferably 100 to 150° C. Specifically, if the heat treating temperature is 180° C. or less, it is preferable because a resin substrate having low heat resistance such as PEN can be used as a substrate.

Heat treating time is usually preferably 1 second to 24 hours, but it is also preferable that the heat treating time is controlled based on treating temperature. For example, when the temperature is from 70 to 180° C., 10 minutes to 24 hours is more preferable, 20 minutes to 6 hours is further preferable, and 30 minutes to 3 hours is especially preferable. When the temperature is from 180 to 260° C., 6 minutes to 4 hours is more preferable, and 15 minutes to 2 hours is especially preferable. When the temperature is from 260 to 300° C., 30 seconds to 4 hours is more preferable, and 1 minute to 2 hours is especially preferable. When the temperature is from 300 to 350° C., 1 second to 1 hour is more preferable, and 2 seconds to 30 minutes is especially preferable.

Heat treatment is preferably conducted in an inert gas under $10^{-3}$ Pa or less of oxygen partial pressure, or after a semi-conductor layer is covered with a protective layer. If either of conditions is selected, reproducibility is improved.

(4-3) Thin Film Transistor Properties

In the thin film transistor of the present invention, mobility is preferably 1 $cm^2$/Vs or more, more preferably 3 $cm^2$/Vs or more, and especially preferably 8 $cm^2$/Vs or more. If the mobility is 1 $cm^2$/Vs or more, switching rate does not become slow, and then the transistor is preferably used for big-screen, high-fineness display.

ON-OFF rate is preferably $10^6$ or more, more preferably $10^7$ or more, and especially preferably $10^8$ or more.

OFF current is preferably 2 pA or less, and more preferably 1 pA or less. If the OFF current is 2 pA or less, sufficient contrast is obtained and excellent uniformity of display is also obtained when the transistor is used for TFT of the display.

Gate-leak current is preferably 1 pA or less. If the gate-leak current is 1 pA or more, excellent contrast is obtained when the transistor is used for TFT of the display.

Threshold voltage is usually 0 to 10V, preferably 0 to 4V, more preferably 0 to 3V, and especially preferably 0 to 2V. If the threshold voltage is 0V or more, normally-ON is avoided, no voltage is needed during OFF, and then electric power consumption can be kept lower. If the threshold voltage is 10V or more, driving voltage can be kept lower, electric power consumption can be kept lower, and mobility can also be kept lower.

S value is preferably 0.8V/dec or less, more preferably 0.3V/dec or less, further preferably 0.25V/dec or less, and especially preferably 0.2V/dec or less. If S value is 0.8V/dec or less, driving voltage does not become higher and then electric power consumption becomes lower. Especially, when the transistor is used for an organic light emitting display, because of direct current drive, if S value is 0.3V/dec or less, electric power consumption is preferably and enormously reduced.

Threshold voltage shift between before and after applying 10 µA of direct current voltage at 50° C. for 100 hours is preferably 1.0V or less, and more preferably 0.5V or less. If the shift is 1.0V or less, image quality does not change if the transistor is used for a transistor of an organic light emitting display.

Smaller hysteresis during gate voltage being up and down in transfer curve is preferable.

Ratio of channel width (W) and channel length (L) (W/L) is normally 0.1 to 100, preferably 0.5 to 20, and especially preferably 1 to 8. If W/L is 100 or less, leak current does not increase, ON-OFF ratio would be lowered. If W/L is 0.1 or more, field effect mobility is not lowered, and pinch off becomes clear. The channel length (L) is normally 0.1 to 1000 µm, preferably 1 to 100 µm, and more preferably 2 to 10 µm. If the channel length (L) is 0.1 µm or more, there is no possibility to become industrial manufacture difficult and to become leak current higher. If the channel length (L) is 1000 µm or less, an element does not become too big.

The thin film transistor of the present invention preferably has a structure for shading a semi-conductor layer. If there is a structure for shading a semi-conductor layer (e.g. a shading layer), there is no possibility to excite a carrier electron when light comes in the semi-conductor layer and then to become OFF current higher. The shading layer preferably includes a thin film having absorption between 300 nm and 800 nm. The shading layer may be located on either upper or lower portion of the semi-conductor layer, but the shading layer is preferably located on both upper and lower portions. The shading layer may also be used as a gate insulation film and a black matrix. If the shading layer is present only on one side, it is necessary to improve its structure not to radiate light to a semi-conductor layer from another side where no shading layer is present.

The thin film transistor of the present invention may have a contact layer between a semi-conductor layer and a source electrode or a drain electrode. The contact layer preferably has lower resistance than that of a semi-conductor layer. Forming materials of the contact layer may include a composite oxide having similar composition to that of the above-mentioned semi-conductor layer. That is, the contact layer preferably contains each element such as In, Zn or Zr. If these elements are included, transfer of elements between the contact layer and the semi-conductor layer is not occurred, and threshold voltage shift during stress test, etc. does not become too big.

There is not limitation for a preparation method of the contact layer, but a contact layer having the same composition ratio as that of the semi-conductor layer may be formed by changing film forming conditions; a layer having different composition ratio from that of the semi-conductor layer may be formed; a layer may be constructed by heightening resistance at a portion contacting with an electrode of the semi-conductor by plasma treatment or ozone treatment; or a layer having higher resistance by varying film forming conditions such as partial pressure for oxygen may be formed during forming a semi-conductor. The field effect type transistor of the present invention preferably contains an oxygen resistance layer having a resistance higher than that of the semi-conductor layer between a semi-conductor layer and a gate insulation layer, and/or between a semi-conductor layer and a protective layer. If there is an oxide resistance layer, OFF current is not detected, normally-ON caused by negative threshold can be avoided, and there is no deterioration on properties caused by changing semi-conductor's quality during post-treating step such as forming a protective film or etching.

The oxide resistance layer may include as follows.

an amorphous oxide film having the same composition ratio as that of the semi-conductor layer which film is formed under a higher partial pressure of oxygen than that during forming the semi-conductor layer an amorphous oxide film having the same composition as that of the semi-conductor layer but having different composition ratio from that of the semi-conductor layer an amorphous oxide film containing not only In and Zn but also element X which is different from that in the semi-conductor layer a multi-crystalline oxide film containing indium oxide as a major component a multi-crystalline oxide film containing indium oxide as a major component, which film is doped by one or more positive bivalent elements such as Zn, Cu, Co, Ni, Mn, or Mg If the amorphous oxide film having the same composition as that of the semi-conductor layer but having different composition ratio from that of the semi-conductor layer, or the amorphous oxide film containing not only In and Zn but also element X which is different from that in the semi-conductor layer, In composition ratio is preferably less than that of the semi-conductor layer. The composition ratio for the element X is preferably higher than that of the semi-conductor layer.

The oxide resistance layer is preferably an oxide containing In and Zn. If these elements are contained, transfer of elements between the oxide resistance layer and the semi-conductor layer is not occurred, and threshold voltage shift during stress test, etc. does not become too big.

Although examples of the present invention are shown as follows, the following examples do not intend to limit the scope of the present invention.

EXAMPLES

Sintering Tests 1-6

An $In_2O_3$ powder having specific surface area of 15 $m^2/g$, a $Ga_2O_3$ powder having specific surface area of 4 $m^2/g$, and a ZnO powder having specific surface area of 4 $m^2/g$ were mixed, then an auxiliary agent was added, and then mixed and ground in a ball mil until each of crude powders has a particle size of 1 μm or less. Thus obtained slurry was picked out, and conducted to rapid-dry grinding using a spray dryer under slurry supply speed of 140 ml/min., hot air temperature of 140° C., and hot air amount of 8 $Nm^3$/min. The ground material was formed under pressure of 3 ton/$cm^2$ using a cold isostatic press to obtain a formed body.

This formed body was placed in atmosphere and raising temperature at rate of 0.5° C./min. up to 600° C., at rate of 1° C./min. between 600 to 800° C., and at rate of 3° C./min. between 800 to 1500° C. Then 1200° C. was kept for 2 hours to obtain a sintered body. Composition of thus obtained sintered body analyzed by ICP, and a crystal phase was confirmed by X-ray diffraction under the following condition.

X-ray diffraction measurements (XRD)
Device: RIGAKU Co., Ultima-III
X-ray: Cu—Kα-ray (Wave length 1.5406 Å, monochromated by a graphite monochromator)
2θ-θ reflection method, continuous scanning (1.0°/min.)
Sampling interval: 0.02°
Slit DS, SS: 2/3°, RS:0.6 mm Sintering tests 2 to 15 were conducted using the same conditions as those of Sintering test 1 except for conditions shown in the tables.

If content ratio of In and Ga is within the specific range (Ga/(In+Zn+Ga)<In/(In+Zn+Ga)) or under the specific sintering temperature or sintering time (1230 to 1350° C. for 30 to 60 hours, or 1350 to 1450° C. for 0.5 to 8 hours), a sintered body consisting only of an InGa(ZnO) crystal phase was obtained.

In Sintering test 11, a peak similar to those of Sintering test 1 was confirmed between 2θ=62 degree and 63 degree based on X-ray diffraction.

FIGS. 1 to 8 show X-ray diffraction charts for Sintering tests 1, 2, 4-8 and 11.

Sintering Test 17-20

An $In_2O_3$ powder, a $Ga_2O_3$ powder, and a ZnO powder, each having 4N purity (produced by Kojundo Chemical Laboratory Co., Ltd.), were weight to meet 1:1:1 at atom ratio of In, Ga and Zn, and contained with zirconia beads in a polyamide container. Then ethanol was added, and unraveled using the planetary ball mill device again for 1 hour. The obtained material was formed in a disc configuration by a uniaxial pressing (100 kg/$cm^2$), sintered under ambient pressure at 1300 to 1700° C. for 2 hours, and then obtained an oxide sintered body having $InGaO_3(ZnO)$ as a main component at 1400° C. By looking it by X-ray diffraction in detail, a peak was confirmed between 2θ=62 degree and 63 degree. $In_2O_3$ was a main component at 1550° C. or more. Forming of $InGaO_3(ZnO)$ was not confirmed at 1550° C. or more. That is, even if a sintering temperature varies between 1300° C. and 1700° C., any sintered body only comprising of $InGaO_3(ZnO)$, which has no peek between 2θ=62 degree and 63 degree, was not obtained.

FIG. 9 shows X-ray diffraction chart for Sintering test 18.
(Evaluation for Sintered Bodies Prepared by the Sintering Tests)

A processing, backing plate was attached to sintered bodies prepared by Sintering tests 9 to 5 so as to use the bodies as a sputtering target. A thin film transistor having thickness of a semi-conductor film of 30 nm and 50 nm was formed on Si substrate with $SiO_2$ thermally-oxidized film (100 nm) by using RF magnetron sputter, and evaluated.

A sintered body only consisting of InGa(ZnO) crystal phase without $Ga_2O_3$ crystal phase, $ZnGa_2O_4$ crystal phase, $In_2O_3$ crystal phase, ZnO crystal phase, $In_2O_3(ZnO)_3$ crystal phase, and $InGaO_3$ crystal phase as a sputtering target (Sintering test 4, 5, 12, 13, 14, and 15) had good properties (variation of film-forming speed, shifting of composition ratio of a semi-conductor, reproducibility and uniformity in properties of a thin film transistor).

The properties of a thin film transistor depend on composition ratio of In and Ga; In/(In+Ga). The properties (mobility, S value) of a thin film transistor having high In/(In+Ga), especially 0.55 or higher were good (FIG. 10).

Results are shown in Tables 1 and 2 as follows. "-" in the column "Presence or absence of a peak 2θ=62 degree and 63 degree" in Tables means no peak was confirmed.

TABLE 1

| | | | SINTERING TESTS | | | | | | | | | |
|---|---|---|---|---|---|---|---|---|---|---|---|---|
| | | | 1 | 2 | 3 | 4 | 5 | 6 | 7 | 8 | 9 | 10 |
| PRODUCING CONDITIONS OF A SINTERED BODY (A TARGET) | FORMING METHOD | | CIP | CIP | CIP | CIP | CIP | CIP | CIP | CIP | CIP | CIP |
| | SINTERING METHOD | | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE |
| | SINTERING ATMOSPHERE | | ATMOSPHERIC AIR | ATMOSPHERIC AIR | ATMOSPHERIC AIR | ATMOSPHERIC AIR | ATMOSPHERIC AIR | ATMOSPHERIC AIR | ATMOSPHERIC AIR | ATMOSPHERIC AIR | ATMOSPHERIC AIR | ATMOSPHERIC AIR |
| | SINTERING TEMPERATURE | | 1200 | 1200 | 1300 | 1300 | 1400 | 1400 | 1500 | 1500 | 1300 | 1300 |
| | SINTERING TIME | | 2 | 20 | 2 | 20 | 2 | 20 | 2 | 20 | 20 | 20 |
| COMPOSITION RATIO OF A SINTERED BODY | $In/(In+Ga+Zn)$ | | 0.35 | 0.35 | 0.35 | 0.35 | 0.35 | 0.35 | 0.35 | 0.35 | 0.35 | 0.35 |
| | $Ga/(In+Ga+Zn)$ | | 0.2 | 0.2 | 0.2 | 0.2 | 0.2 | 0.2 | 0.2 | 0.2 | 0.5 | 0.37 |
| | $Zn/(In+Ga+Zn)$ | | 0.45 | 0.45 | 0.45 | 0.45 | 0.45 | 0.45 | 0.45 | 0.45 | 0.25 | 0.28 |
| | $In/(In+Ga)$ | | 0.636 | 0.636 | 0.636 | 0.636 | 0.636 | 0.636 | 0.636 | 0.636 | 0.412 | 0.486 |
| CRYSTALLINE FORM OF A SINTERED BODY (XRD) | $InGaZnO_4$ | JCPDS CARD No.38-1104 | ◎ | | ◎ | ◎ | ◎ | ○ | | | | ◎ |
| | $InGaZn_2O_5$ | JCPDS CARD No.40-0252 | | ○ | | | | | | | | |
| | $\beta\text{-}Ga_2O_3$ | JCPDS CARD No.43-1012 | | | | | | | | | ◎ | |
| | $ZnGa_2O_4$ | JCPDS CARD No.38-1240 | | | | | | | ◎ | ◎ | | |
| | $In_2O_3$ | JCPDS CARD No.06-0416 | ○ | | ○ | | | ◎ | ◎ | ◎ | ○ | ○ |
| | $\beta\text{-}GaInO_3$ | JCPDS CARD No.21-0334 | | | | | | | | | | |
| | $In_2Ga_2ZnO_7$ | JCPDS CARD No.38-1097 | | | | | | | | | | |
| | $In_2O_3(ZnO)_7$ | JCPDS CARD No.20-1439 | | | | | | | | | | |
| | UNKNOWN RATIO OF MAXIMUM PEAK | (MAXIMUM PEAK OF OTHER THAN $InGaZnO_4$/ $InGaZnO_4$ PEAK) × 100(%) | PEAK OF $InGaZnO_4$ WAS NOT CONFIRMED | PEAK OF $InGaZnO_4$ WAS NOT CONFIRMED | 20 | PEAK OTHER THAN $InGaZnO_4$ WAS NOT CONFIRMED | PEAK OTHER THAN $InGaZnO_4$ WAS NOT CONFIRMED | 10000 | PEAK OF $InGaZnO_4$ WAS NOT CONFIRMED | PEAK OF $InGaZnO_4$ WAS NOT CONFIRMED | PEAK OF $InGaZnO_4$ WAS NOT CONFIRMED | 30 |
| PRESENCE OR ABSENCE OF A PEAK BETWEEN $2\theta = 62$ DEGREE AND 63 DEGREE | | | — | — | — | — | — | — | — | — | PRESENT | PRESENT |

TABLE 2

| | | | SINTERING TESTS | | | | | | | | | |
|---|---|---|---|---|---|---|---|---|---|---|---|---|
| | | | 11 | 12 | 13 | 14 | 15 | 16 | 17 | 18 | 19 | 20 | 21 |
| PRODUCING CONDITIONS OF A SINTERED BODY (A TARGET) | FORMING METHOD | | CIP | CIP | CIP | CIP | CIP | CIP | CIP | CIP | CIP | CIP | CIP |
| | SINTERING METHOD | | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE |
| | SINTERING ATMOSPHERE | | AIR | AIR | AIR | AIR | AIR | AIR | AIR | AIR | AIR | AIR | AIR |
| | SINTERING TEMPERATURE | | 1300 | 1300 | 1300 | 1300 | 1300 | 1300 | 1300 | 1400 | 1500 | 1600 | 1700 |
| | SINTERING TIME | | 20 | 20 | 20 | 20 | 20 | 20 | 2 | 2 | 2 | 2 | 2 |
| COMPOSITION RATIO OF A SINTERED BODY | In/(In + Ga + Zn) | | 0.33 | 0.35 | 0.35 | 0.35 | 0.35 | 0.35 | 0.333 | 0.333 | 0.333 | 0.333 | 0.333 |
| | Ga/(In + Ga + Zn) | | 0.33 | 0.33 | 0.28 | 0.23 | 0.17 | 0.05 | 0.333 | 0.333 | 0.333 | 0.333 | 0.333 |
| | Zn/(In + Ga + Zn) | | 0.34 | 0.32 | 0.37 | 0.42 | 0.48 | 0.6 | 0.333 | 0.333 | 0.333 | 0.333 | 0.333 |
| | In/(In + Ga) | | 0.500 | 0.515 | 0.556 | 0.636 | 0.673 | 0.875 | 0.500 | 0.500 | 0.500 | 0.500 | 0.500 |
| CRYSTALLINE FORM OF A SINTERED BODY (XRD) | InGaZnO$_4$ | JCPDS CARD No.38-1104 | ◎ | ◎ | ◎ | ◎ | ◎ | | ◎ | ◎ | ◎ | ◎ | ◎ |
| | InGaZn$_2$O$_5$ | JCPDS CARD No.40-0252 | | | | | | | | | ○ | | |
| | β-Ga$_2$O$_3$ | JCPDS CARD No.43-1012 | | | | | | | | | | | |
| | ZnGa$_2$O$_4$ | JCPDS CARD No.38-1240 | | | ○ | | | ○ | | | | | |
| | In$_2$O$_3$ | JCPDS CARD No.06-0416 | | | | | | | ○ | | | | |
| | β-GaInO$_3$ | JCPDS CARD No.21-0334 | | | | | | ◎ | | | | | |
| | In$_2$Ga$_3$ZnO$_7$ | JCPDS CARD No.38-1097 | | | | | | | | ○ | | | |
| | In$_2$O$_3$(ZnO)$_7$ | JCPDS CARD No.20-1439 | | | | | | | | | | | |
| | UNKNOWN | | ○ | | | | | | | | | ○ | ○ |

TABLE 2-continued

| | SINTERING TESTS | | | | | | | | | | |
|---|---|---|---|---|---|---|---|---|---|---|---|
| | 11 | 12 | 13 | 14 | 15 | 16 | 17 | 18 | 19 | 20 | 21 |
| RATIO OF MAXIMUM PEAK (MAXIMUM PEAK OTHER THAN $InGaZnO_4$ / $InGaZnO_4$ PEAK) × 100 (%) | 6 | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OF $InGaZnO_4$ WAS NOT CONFIRMED | 20 | 4 | 110 | PEAK OF $InGaZnO_4$ WAS NOT CONFIRMED | PEAK OF $InGaZnO_4$ WAS NOT CONFIRMED |
| PRESENCE OR ABSENCE OF A PEAK BETWEEN 2θ = 62 DEGREE AND 63 DEGREE | PRESENT | — | — | — | — | — | PRESENT | PRESENT | PRESENT | PRESENT | PRESENT |

(Preparation of a Sputtering Target)

As for crude powders, an indium oxide powder having specific surface area of 6 m²/g, a gallium oxide powder having specific surface area of 6 m²/g, and a zinc oxide powder having specific surface area of 6 m²/g were weighed, and then mixed and ground by a wet-type medium agitating mill. Zirconia beads having 1 mm φ were used as the medium of the wet-type medium agitating mill. The specific surface area after the grinding was increased 2 m²/g greater than that of the crude mixed powder, and then dried by a spray dryer. The obtained mixed powder was filled in a metal mold, and then press formed by a cold press device to make a formed body. Thus obtained formed body was sintered under oxygen atmosphere at high temperature of 1300° C. for 8 hours to obtain a sintered body without conducting a calcining step. The composition of the obtained sintered body analyzed by ICP was In:Ga:Zn=35:20:45.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 μm or less. Then, the surface was air-blew and cleaned using ultrasonic cleaning for 3 minutes by multi-oscillating 12 kinds of frequency in every 25 KHz within frequency from 25 to 300 KHz. This target material was then bonded on a backing plate made by oxygen free copper by using an indium solder so as to prepare a target. Surface roughness of the target is Ra≤0.5 μm, and the target has a ground surface with no directional character.

(Evaluation for a Sputtering Target)

Relative Density

The relative density was calculated from theoretical density calculated from density of a crude powder and density of a sintered body determined by Archimedes method using the following formula.

Relative Density=(Density determined by Archimedes method)/(Theoretical Density)×100(%)

Average Crystalline Particle Diameter

The maximum particle diameters was determined by embedding a sintered body in a resin, polishing its surface by aluminum particles having particle size of 0.05 μm, and then, measuring a maximum particle diameter of crystal particles observed within 30 μm×30 μm square frame of the sintered body surface by X-ray microanalyzer (EPMA) named JXA-8621MX (JOEL Ltd.).

Bulk Resistance

Bulk resistance was determined by a resistance meter (Mitsubishi chemical Co., LORESTA) using four-point probe method (JIS R 1637), and calculated from an average value taken from 10 locations.

Uniformity of Bulk resistance

Uniformity of bulk resistance was determined by measuring bulk resistance at 10 locations on the identical target surface, and then obtained a ratio between maximum value and minimum value (maximum value/minimum value). Evaluation was conducted based on 4 levels, from those having excellent uniformity, up to 5: ⊙, up to 10: ○, up to 20: Δ, and more than 20: x.

X-ray diffraction (XRD)

Device: RIGAKU Co., Ultima-III
X-ray: Cu—Kα-ray (Wave length 1.5406 Å, monochromated by a graphite monochromator)
2θ-θ reflection method, continuous scanning (1.0°/min.)
Sampling interval: 0.02°
Slit DS, SS: 2/3°, RS:0.6 mm Nodule Appearance A sputtering target was loaded to DC magnetron sputtering device, using atmosphere having a mix gas of argon gas with 3% of hydrogen gas, and then sputtering was conducted for 30 hours continuously. In this situation, sputtering condition was pressure; $3\times10^{-4}$ Pa, achieved pressure; $5\times10^{-4}$ Pa, substrate temperature; 25° C., and input electric power; 100 W. The hydrogen gas added to the atmosphere gas was intended to accelerate nodule appearance.

Changes of the surface of a target after the sputtering was observed by enlarging 50 times using a stereoscopic microscope, and then number average of nodules having 20 μm or more appeared within the 3 mm² scope was measured. Then, no nodule appearance was observed on the surface of the sputtering target obtained herewith.

(Evaluation for Film-Forming Speed)

Variation (Uniformity) of Film-Forming Speed

Ratio between maximum value and minimum value of film-forming speed of continuous 40 batches (maximum value/minimum value) was determined. Evaluation was conducted based on 4 levels, from those having excellent uniformity in TFT properties, up to 1.03: ⊙, up to 1.05: ○, up to 1.10: Δ, and more than 1.10: x.

Film-forming speed was calculated from a film thickness measured by a sensing pin type surface figure measuring device; Dectak (ULVAC, Inc.) divided by film forming time.

(Preparation of TFT)

An invert staggered TFT (thin film transistor) was prepared by using this target for film forming an active layer.

Specifically, a glass substrate Corning1737 was used as a substrate. On this substrate, Ti having thickness of 5 nm, Au having thickness of 50 nm, and Ti having thickness of 5 nm were laminated in this order by an electron beam vapor deposition method. A gate electrode was formed from the laminated film by a photo-lithography method and a lift-off method. Ti was used as an adhesive layer.

A $SiO_2$ film having thickness of 200 nm was formed on the upper surface thereof by a TEOS-CVD method so as to form a gate insulation film. Sputtering method can be used for film-forming of the gate insulation film, but CVD method such as TEOS-CVD method or PECVD method is preferable. Sputtering method may make OFF current higher.

Subsequently, by a DC magnetron sputter method using the above-mentioned sintered body as a target, In—Ga—Zn—O oxide semi-conductor having a thickness of 30 nm was deposited as a channel layer. $SiO_2$ film was further deposited thereon as an etching stopper layer (a protective film) by a sputter method. A film-forming method for the protective film may be CVD method.

The present examples used 200 W for imposed RF power. Atmosphere at the film-forming was total pressure; 0.4 Pa, and gas flow rate at that time; Ar:$O_2$=95:5. Temperature of a substrate was 25° C.

The deposited In—Ga—Zn—O oxide semi-conductor was processed to an appropriate size by using a photo-lithography method and an etching method.

Ti having thickness of 5 nm, Au having thickness of 50 nm, and Ti having thickness of 5 nm were laminated in this order on each element, and a source electrode and a drain electrode were formed by a photo-lithography method and a lift-off method.

Elements were conducted to a heat treatment in atmosphere, at 300° C. for 60 minutes.

(Evaluation for TFT)

Mobility, S value, ON-OFF ratio, reproducibility in TFT properties, and uniformity in TFT properties were evaluated and shown in Tables.

Those evaluations were conducted using the following processes.

Mobility, S Value, and ON-OFF Ratio

Mobility, S value, and ON-OFF ratio were determined by using a semi-conductor parameters analyzer (Keithley 4200) under dry nitrogen, ambient temperature and shading.

Reproducibility in TFT Properties

Among continuous 40 batches, ratio of average field effect mobility between 1st batch and 40th batch (1st batch/40th batch) was determined. Evaluation was conduct based on 4 levels, from those having excellent reproducibility in TFT properties, up to 1.10: ⊚, up to 1.20: ○, up to 1.50: Δ, and more than 1.50: x.

Uniformity in TFT Properties

Ratio between maximum value and minimum value (maximum value/minimum value) of On-current at Vg within the same panel=5V was determined. Evaluation was conduct based on 4 levels, from those having excellent uniformity in TFT properties, up to 1.05: ⊚, up to 1.10: ○, up to 1.20: Δ, and more than 1.20: x.

Examples 2 to 16, Comparative examples 1 to 9

Preparations and evaluations were the same as those of Example 1 except for composition and preparation conditions as shown in Tables.

Example 17

Preparation of a Sputtering Target

As for crude powders, an indium oxide powder having an average median diameter (d50) of 1.5 µm, a gallium oxide powder having an average median diameter (d50) of 1.5 µm, and a zinc oxide powder having an average median diameter (d50) of 1.0 µm were weighed, and then mixed and ground by a wet-type medium agitating mill. The average median diameter (d50) after the grinding was set to 0.8 µm, and then dried by a spray dryer, filled in a metal mold, press formed by a cold press device to make a formed body, and then sintered under oxygen atmosphere at high temperature of 1300° C. for 20 hours. By using such steps, a sintered body for a sputtering target could be obtained without conducting a calcining step like as Example 1. The composition ratio of the obtained sintered body other than oxide analyzed by ICP was In:Ga:Zn=35:23:42.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 µm or less. Then, the surface was air-blew and cleaned using ultrasonic cleaning for 3 minutes by multi-oscillating 12 kinds of frequency in every 25 KHz within frequency from 25 to 300 KHz. This sputtering target material was then bonded on a backing plate made by oxygen free copper by using an indium solder so as to prepare a sputtering target. Surface roughness of the target is Ra≤0.5 µm, and the target has a ground surface with no directional character.

After that, evaluations of a sputtering target, evaluations of film-forming speed, preparation and evaluation of TFT were conducted in the same manner as Example 1.

Example 18

Preparation of a Sputtering Target

An $In_2O_3$ powder, a $Ga_2O_3$ powder, and a ZnO powder, each having 4N purity or equivalent, were blended, then wet-mixed and dried, and then calcined at 1100° C. After the calcination, a wet-type fine grinding was conducted until an average particle size became 1 µm, then thus ground powder was filled in a forming mold, and cold isostatic press (CIP) was conducted. Sintering was then conducted under oxygen atmosphere at 1300° C. for 20 hours under ambient pressure to obtain a sintered body for a sputtering target. The composition ratio of the obtained sintered body other than oxide analyzed by ICP was In:Ga:Zn=35:23:42.

A sintered body for a sputtering target was carved out from thus obtained sintered body. A side of the sintered body for a sputtering target cut by a diamond cutter. The surface thereof was ground by a flat-surface grinding machine to make a sputtering target material having surface roughness Ra of 5 µm or less. Then, the surface was air-blew and cleaned using ultrasonic cleaning for 3 minutes by multi-oscillating 12 kinds of frequency in every 25 KHz within frequency from 25 to 300 KHz. This target material was then bonded on a backing plate made by oxygen free copper by using an indium solder so as to prepare a sputtering target. Surface roughness of the target is Ra≤0.5 µm, and the target has a ground surface with no directional character.

After that, evaluations of a sputtering target, evaluations of film-forming speed, preparation and evaluation of TFT were conducted in the same manner as Example 1.

Example 19

Preparation of a Sputtering Target

An indium oxide powder, a gallium oxide powder, and a zinc oxide powder were sintered under atmosphere at 800 to 1100° C., and then weighed and mixed. After that, sintering was conducted under oxygen at 1250° C. for 7 days so as to obtain a composite oxide powder. The composite oxide powder was mixed and ground by a wet-type medium agitating mill to make an average median diameter (d50) to 0.8 µm. The obtained mixed powder, which was dried by a spray dryer, was filled in a metal mold, press formed by a cold press device. The formed body contained a complex oxide having a homologous crystal structure of $InGaO_3(ZnO)$ confirmed by X-ray diffraction, and no peak was confirmed between 2θ=62 degree and 63 degree based on X-ray diffraction. In addition, sintering was conducted under oxygen atmosphere at high temperature of 1400° C. for 2 hours. By using such steps, a sintered body for a sputtering target could be obtained. The composition ratio of the obtained sintered body other than oxide analyzed by ICP was In:Ga:Zn=33:33:34. By X-ray diffraction, it was confirmed that the sintered body only contained a homologous crystal structure of $InGaO_3(ZnO)$, and no peak was confirmed between 2θ=62 degree and 63 degree based on X-ray diffraction.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 µm or less. Then, the surface was air-blew and cleaned using ultrasonic cleaning for 3 minutes by multi-oscillating 12 kinds of frequency in every 25 KHz within frequency from 25 to 300 KHz. This sputtering target material was then bonded on a backing plate made by oxygen free copper by using an indium solder so as to prepare a sputtering target. Surface roughness of the target is Ra≤0.5 µm, and the target has a ground surface with no directional character.

After that, evaluations of a sputtering target, evaluations of film-forming speed, preparation and evaluation of TFT were conducted in the same manner as Example 1.

Example 20

A target was produced in the same manner as Example 18, except that sintering temperature was 1300° C., and sintering time was 20 hours.

After that, evaluations of a sputtering target, evaluations of film-forming speed, preparation and evaluation of TFT were conducted in the same manner as Example 1.

Example 21

A target was produced in the same manner as Example 18, except that Sn was contained in an amount of 500 ppm.

After that, evaluations of a sputtering target, evaluations of film-forming speed, preparation and evaluation of TFT were conducted in the same manner as Example 1.

Example 22

Preparation of a Sputtering Target

An indium oxide powder, a gallium oxide powder, and a zinc oxide powder were sintered under atmosphere at 800 to 1000° C., and then weighed and mixed. After that, sintering was conducted under oxygen at 1250° C. for 7 days so as to obtain a composite oxide powder. The composite oxide powder had a homologous crystal structure of $InGaO_3(ZnO)$ confirmed by X-ray diffraction. Thus obtained composite oxide powder was conducted to a discharge plasma sintering (SPS) applying 100 to 1000 $A/cm^2$ for 5 min. to 1 hour with press forming the powder.

A sintered body for a sputtering target could thus be obtained. The composition ratio of the obtained sintered body other than oxide analyzed by ICP was In:Ga:Zn=33:33:34.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 μm or less. Then, the surface was air-blew and cleaned using ultrasonic cleaning for 3 minutes by multi-oscillating 12 kinds of frequency in every 25 KHz within frequency from 25 to 300 KHz. This sputtering target material was then bonded on a backing plate made by oxygen free copper by using an indium solder so as to prepare a target. Surface roughness of the sputtering target is Ra≤0.5 μm, and the target has a ground surface with no directional character.

After that, evaluations of a sputtering target, evaluations of film-forming speed, preparation and evaluation of TFT were conducted in the same manner as Example 1.

Example 23

Preparation of a Sputtering Target

An indium oxide powder, a gallium oxide powder, and a zinc oxide powder were sintered under atmosphere at 800 to 1100° C., and then weighed and mixed. After that, sintering was conducted under oxygen at 1250° C. for 7 days so as to obtain a composite oxide powder. The composite oxide powder had a homologous crystal structure of $InGaO_3(ZnO)$ confirmed by X-ray diffraction. Thus obtained composite oxide powder was sintered within a forming die with press forming (Hot press method).

A sintered body for a sputtering target could thus be obtained. The composition ratio of the obtained sintered body other than oxide analyzed by ICP was In:Ga:Zn=33:33:34.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 μm or less. Then, the surface was air-blew and cleaned using ultrasonic cleaning for 3 minutes by multi-oscillating 12 kinds of frequency in every 25 KHz within frequency from 25 to 300 KHz. This sputtering target material was then bonded on a backing plate made by oxygen free copper by using an indium solder so as to prepare a sputtering target. Surface roughness of the sputtering target is Ra≤0.5 μm, and the target has a ground surface with no directional character.

After that, evaluations of a sputtering target, evaluations of film-forming speed, preparation and evaluation of TFT were conducted in the same manner as Example 1.

Example 24

Preparation of a Sputtering Target

As for crude powders, an indium oxide powder having specific surface area of 6 $m^2/g$, a gallium oxide powder having specific surface area of 6 $m^2/g$, and a zinc oxide powder having specific surface area of 6 $m^2/g$ were weighed, and then mixed and ground by a wet-type medium agitating mill. Zirconia beads having 1 mm φ were used as the medium of the wet-type medium agitating mill. The specific surface area after the grinding was increased 2 $m^2/g$ greater than that of the crude mixed powder, and then dried by a spray dryer so as to obtain a mixed powder. The obtained mixed powder was calcined at 1200° C. for 10 hours, and ground by a ball mill. These steps were repeated 5 times. The grinding was conducted to keep an average particle diameter within 0.01 to 3.0 μm.

The obtained mixed powder was then filled in a metal mold, and press formed by a cold press device to make a formed body. The formed body contained a composite oxide $InGaO_3(ZnO)$ containing In, Zn, and Ga.

The obtained formed body was sintered under oxygen atmosphere at high temperature of 1400° C. for 2 hours to obtain a sintered body. The composition of the obtained sintered body analyzed by ICP was In:Ga:Zn=1:1:1.

A sintered body for a sputtering target was carved out from thus obtained sintered body. A side of the sintered body for a sputtering target cut by a diamond cutter. The surface thereof was ground by a flat-surface grinding machine to make a target material having surface roughness Ra of 5 μm or less. Then, the surface was air-blew and cleaned using ultrasonic cleaning for 3 minutes by multi-oscillating 12 kinds of frequency in every 25 KHz within frequency from 25 to 300 KHz. This target material was then bonded on a backing plate made by oxygen free copper by using an indium solder so as to prepare a sputtering target. Surface roughness of the target is Ra≤0.5 μm, and the target has a ground surface with no directional character.

After that, evaluations of a sputtering target, evaluations of film-forming speed, preparation and evaluation of TFT were conducted in the same manner as Example 1.

Comparative Examples 1-3 and 5-10

A sputtering target was produced in the same manner as Example 1, except that sintering temperature, sintering time, and composition were shown in Tables.

After that, evaluations of a sputtering target, evaluations of film-forming speed, preparation and evaluation of TFT were conducted in the same manner as Example 1.

The same nodule appearance test as that of Example 1 was conducted by using the sputtering target of Comparative Example 8. 23 nodules were observed on the surface of the target.

Comparative Example 4

An $In_2O_3$ powder having specific surface area of 10.5 m$^2$/g and a $Ga_2O_3$ powder having specific surface area of 11.2 m$^2$/g each of which contains 25 mol %, and 50 mol % of a ZnO powder having specific surface area of 8.5 m$^2$/g were blended, and then mixed and ground by a beads mill until each crude powder has a particle size of 1 μm or less. During the mixing and grinding, 1 mass % of polyvinylalcohol was added as a binder. The specific surface area was determined by MacsobHMmodel-1208 produced by Mountech Co. Ltd. Thus obtained slurry was picked out, and conducted to rapid-dry grinding using a spray dryer under slurry supply speed of 140 ml/min., hot air temperature of 140° C., and hot air amount of 8 Nm$^3$/min. The ground material was formed under pressure of 3 ton/cm$^2$ using a cold isostatic press to obtain a formed body.

This formed body was placed in atmosphere and raising temperature at rate of 0.5° C./min. up to 600° C., at rate of 1° C./min. between 600 to 800° C. with oxygen gas flowed at 10 L/min. of flow rate, and at rate of 3° C./min. between 800 to 1300° C. Then 1300° C. was kept for 20 hours to obtain a sintered body.

It was confirmed based on X-ray diffraction that crystal structure of this sintered body was a homologous crystal structure represented by $InGaO_3(ZnO)$. It was also confirmed in detail that although no diffraction peak derived from $Ga_2O_3$ was detected, a peak was confirmed between 2θ=62 degree and 63 degree.

After that, evaluations of a sputtering target, evaluations of film-forming speed, preparation and evaluation of TFT were conducted in the same manner as Example 1.

The results of Examples and Comparative Examples were shown in the following Tables 3 to 5. ("-" in the column "Presence or absence of peaks" in Tables means no peak was confirmed.)

TABLE 3

| | | | EXAMPLES | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| PRODUCING CONDITIONS OF A SINTERED BODY (A TARGET) | FORMING METHOD | | CIP | CIP | CIP | CIP | CIP | CIP | CIP | CIP | CIP | CIP | CIP | CIP |
| | SINTERING METHOD | | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE |
| | SINTERING ATMOSPHERE | | OXYGEN | OXYGEN | OXYGEN | OXYGEN | OXYGEN | OXYGEN | OXYGEN | OXYGEN | OXYGEN | OXYGEN | OXYGEN | OXYGEN |
| | SINTERING TEMPERATURE | | 1300 | 1300 | 1300 | 1300 | 1360 | 1400 | 1400 | 1300 | 1300 | 1300 | 1300 | 1300 |
| | SINTERING TIME | | 8 | 20 | 20 | 30 | 5 | 2 | 5 | 20 | 20 | 20 | 20 | 20 |
| COMPOSITION RATIO OF A SINTERED BODY | In/(In + Ga + Zn) | | 0.35 | 0.35 | 0.35 | 0.35 | 0.35 | 0.35 | 0.35 | 0.35 | 0.35 | 0.35 | 0.35 | 0.35 |
| | Ga/(In + Ga + Zn) | | 0.2 | 0.2 | 0.2 | 0.2 | 0.2 | 0.2 | 0.2 | 0.23 | 0.23 | 0.23 | 0.23 | 0.23 |
| | Zn/(In + Ga + Zn) | | 0.45 | 0.45 | 0.45 | 0.45 | 0.45 | 0.45 | 0.45 | 0.42 | 0.42 | 0.42 | 0.42 | 0.42 |
| | In/(In + Ga) | | 0.636 | 0.636 | 0.636 | 0.636 | 0.636 | 0.636 | 0.636 | 0.603 | 0.603 | 0.603 | 0.603 | 0.603 |
| METAL HAVING FOUR OR MORE VALENCES IN A SINTERED BODY | KIND OF METAL | | — | — | — | — | — | — | — | — | Sn | Ge | Zr | Ce |
| | CONTENTS (ppm) | | — | — | — | — | — | — | — | — | 500 | 500 | 500 | 500 |
| CRYSTALLINE FORM OF A SINTERED BODY (XRD) | $InGaZnO_4$ | JCPDS CARD No.38-1104 | ◎ | — | ◎ | ◎ | ◎ | ◎ | ◎ | ◎ | ◎ | ◎ | ◎ | ◎ |
| | $InGaZn_2O_5$ | JCPDS CARD No.40-0252 | — | — | — | — | — | — | — | — | — | — | — | — |
| | $\beta\text{-}Ga_2O_3$ | JCPDS CARD No.43-1012 | — | — | — | — | — | — | — | — | — | — | — | — |
| | $ZnGa_2O_4$ | JCPDS CARD No.38-1240 | — | — | — | — | — | — | — | — | — | — | — | — |
| | $In_2O_3$ | JCPDS CARD No.06-0416 | — | — | — | — | — | — | — | — | — | — | — | — |

TABLE 3-continued

| | | EXAMPLES | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| | β-GaInO$_3$ JCPDS CARD No.21-0334 | — | — | — | — | — | — | — | — | — | — | — | — |
| | In$_2$Ga$_2$ZnO$_7$ JCPDS CARD No.38-1097 | — | — | — | — | — | — | — | — | — | — | — | — |
| | In$_2$O$_3$(ZnO)$_7$ JCPDS CARD No.20-1439 | — | — | — | — | — | — | — | — | — | — | — | — |
| | UNKNOWN PEAK BETWEEN 2θ = 62 DEGREE AND 63 DEGREE | — | — | — | — | — | — | — | — | — | — | — | — |
| | PRESENCE OR ABSENCE OF PEAKS (PEAK BETWEEN 2θ = 62 DEGREE AND 63 DEGREE/MAXIMUM PEAK OF InGaZnO$_4$) × 100 (%) | 0 | 0 | 0 | 0 | 0 | 0 | 0 | 0 | 0 | 0 | 0 | 0 |
| | RATIO OF MAXIMUM PEAK (MAXIMUM PEAK OTHER THAN InGaZnO$_4$/InGaZnO$_4$ PEAK) × 100 (%) | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED | PEAK OTHER THAN InGaZnO$_4$ WAS NOT CONFIRMED |
| PROPERTIES OF A SINTERED BODY | RELATIVE DENSITY (%) | 95 | 96 | 96 | 98 | 98 | 96 | 98 | 96 | 99 | 99 | 99 | 99 |
| | AVERAGE CRYSTALLINE PARTICLE DIAMETER (μm) | 3 | 4 | 4 | 8 | 3 | 4 | 8 | 9 | 9 | 9 | 9 | 9 |
| | BULK RESISTANCE (mΩ cm) | 10 | 5 | 5 | 4 | 4 | 10 | 3 | 8 | 1 | 1 | 1 | 1 |
| | UNIFORMITY OF BULK RESISTANCE | ◎ | ◎ | ◎ | ◎ | ◎ | ◎ | ◎ | ◎ | ◎ | ◎ | ◎ | ◎ |

TABLE 3-continued

| | | EXAMPLES | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| FILM-FORMING OF A SEMI-CONDUCTOR FILM | SPUTTER METHOD | DC | DC | RF | DC | DC | DC | DC | DC | DC | DC | DC | DC |
| | VARIATION IN FILM-FORMING SPEED | ◎ | ◎ | ◎ | ◎ | ◎ | ◎ | ◎ | ◎ | ◎ | ◎ | ◎ | ◎ |
| COMPOSITION RATIO OF A SEMI-CONDUCTOR FILM | In/(In + Ga + Zn) | 0.36 | 0.36 | 0.37 | 0.36 | 0.36 | 0.36 | 0.36 | 0.36 | 0.36 | 0.36 | 0.36 | 0.36 |
| | Ga/(In + Ga + Zn) | 0.2 | 0.2 | 0.2 | 0.2 | 0.2 | 0.2 | 0.2 | 0.23 | 0.23 | 0.23 | 0.23 | 0.23 |
| | Zn/(In + Ga + Zn) | 0.44 | 0.44 | 0.43 | 0.44 | 0.44 | 0.44 | 0.44 | 0.41 | 0.41 | 0.41 | 0.41 | 0.41 |
| | In/(In + Ga) | 0.643 | 0.643 | 0.649 | 0.643 | 0.643 | 0.643 | 0.643 | 0.610 | 0.610 | 0.610 | 0.610 | 0.610 |
| | VARIATION OF CONTENT RATIO (%) | 1.0 | 1.0 | 2.0 | 1.0 | 1.0 | 1.0 | 1.0 | 1.1 | 1.1 | 1.1 | 1.1 | 1.1 |
| PROPERTIES OF A THIN FILM TRANSISTOR | MOBILITY (cm²/Vs) | 20 | 20 | 19 | 20 | 20 | 20 | 20 | 20 | 20 | 20 | 20 | 20 |
| | S VALUE | 0.2 | 0.2 | 0.2 | 0.2 | 0.2 | 0.2 | 0.2 | 0.1 | 0.1 | 0.1 | 0.1 | 0.1 |
| | ON-OFF RATIO | >10¹⁰ | >10¹⁰ | >10¹⁰ | >10¹⁰ | >10¹⁰ | >10¹⁰ | >10¹⁰ | >10¹⁰ | >10¹⁰ | >10¹⁰ | >10¹⁰ | >10¹⁰ |
| | REPRODUCIBILITY | ◎ | ◎ | ◎ | ◎ | ◎ | ◎ | ◎ | ◎ | ◎ | ◎ | ◎ | ◎ |
| | UNIFORMITY (RATIO IN MOBILITY) | ◎ | ◎ | ○ | ◎ | ◎ | ◎ | ◎ | ◎ | ◎ | ◎ | ◎ | ◎ |

TABLE 4

| | | EXAMPLES | | | | | | | | | | | |
|---|---|---|---|---|---|---|---|---|---|---|---|---|---|
| | | 13 | 14 | 15 | 16 | 17 | 18 | 19 | 20 | 21 | 22 | 23 | 24 |
| PRODUCING CONDITIONS OF A SINTERED BODY (A TARGET) | FORMING METHOD | CIP | CIP | CIP | CIP | CIP | CIP | CIP | CIP | CIP | CIP | HOT PRESS | CIP |
| | SINTERING METHOD | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SPC | HOT PRESS | SINTERING UNDER NORMAL PRESSURE AFTER CALCINATIONS AND GRINDINGS FOR 5 TIMES |
| | SINTERING ATMOSPHERE | OXYGEN | OXYGEN | OXYGEN | OXYGEN | OXYGEN | OXYGEN | OXYGEN | OXYGEN | OXYGEN | VACUUM | ATMOSPHERIC AIR | OXYGEN |
| | SINTERING TEMPERATURE | 1300 | 1300 | 1300 | 1300 | 1300 | 1300 | 1400 | 1300 | 1400 | 1000 | 950 | 1400 |
| | SINTERING TIME | 20 | 20 | 20 | 30 | 20 | 20 | 2 | 20 | 2 | 1 | 10 | 2 |
| COMPOSITION RATIO OF A SINTERED BODY | In/(In + Ga + Zn) | 0.35 | 0.35 | 0.35 | 0.35 | 0.35 | 0.35 | 0.33 | 0.33 | 0.33 | 0.33 | 0.33 | 0.333 |
| | Ga/(In + Ga + Zn) | 0.23 | 0.23 | 0.23 | 0.23 | 0.23 | 0.23 | 0.33 | 0.33 | 0.33 | 0.33 | 0.33 | 0.333 |
| | Zn/(In + Ga + Zn) | 0.42 | 0.42 | 0.42 | 0.42 | 0.42 | 0.42 | 0.34 | 0.34 | 0.34 | 0.34 | 0.34 | 0.333 |
| | In/(In + Ga) | 0.603 | 0.603 | 0.603 | 0.603 | 0.603 | 0.603 | 0.500 | 0.500 | 0.500 | 0.500 | 0.500 | 0.500 |
| METAL HAVING FOUR OR MORE VALENCES IN A SINTERED BODY | KIND OF METAL | Nb | Ta | Mo | W | — | — | — | — | Sn | — | — | — |
| | CONTENTS (ppm) | 500 | 500 | 500 | 500 | — | — | — | — | 500 | — | — | — |
| CRYSTALLINE FORM OF A SINTERED BODY (XRD) | InGaZnO$_4$ JCPDS CARD No.38-1104 | ◎ | ◎ | ◎ | ◎ | ◎ | ◎ | ◎ | ◎ | ◎ | ◎ | ◎ | ◎ |
| | InGaZn$_2$O$_5$ JCPDS CARD No.40-0252 | — | — | — | — | — | — | — | — | — | — | — | — |
| | β-Ga$_2$O$_3$ JCPDS CARD No.43-1012 | — | — | — | — | — | — | — | — | — | — | — | — |
| | ZnGa$_2$O$_4$ JCPDS CARD No.38-1240 | — | — | — | — | — | — | — | — | — | — | — | ○ |
| | In$_2$O$_3$ JCPDS CARD No.06-0416 | — | — | — | — | — | — | — | — | — | — | — | — |
| | β-GaInO$_3$ JCPDS CARD No.21-0334 | — | — | — | — | — | — | — | — | — | — | — | — |
| | In$_2$Ga$_2$ZnO$_7$ JCPDS CARD No.38-1097 | — | — | — | — | — | — | — | — | — | — | — | — |

TABLE 4-continued

| | | EXAMPLES | | | | | | | | | | | |
|---|---|---|---|---|---|---|---|---|---|---|---|---|---|
| | | 13 | 14 | 15 | 16 | 17 | 18 | 19 | 20 | 21 | 22 | 23 | 24 |
| PROPERTIES OF A SINTERED BODY | $In_2O_3(ZnO)_7$ JCPDS CARD No.20-1439 | — | — | — | — | — | — | — | — | — | — | — | — |
| | UNKNOWN PEAK BETWEEN 2θ = 62 DEGREE AND 63 DEGREE | — | — | — | — | — | — | — | — | — | — | — | PRESENT |
| | PRESENCE OR ABSENCE OF PEAKS (PEAK BETWEEN 2θ = 62 DEGREE AND 63 DEGREE/ MAXIMUM PEAK OF $InGaZnO_4$) × 100 (%) | 0 | 0 | 0 | 0 | 0 | 0 | 0 | 0 | 0 | 0 | 0 | 2 |
| | RATIO OF MAXIMUM PEAK (MAXIMUM PEAK OF OTHER THAN $InGaZnO_4$/ $InGaZnO_4$ PEAK) × 100 (%) | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | PEAK OTHER THAN $InGaZnO_4$ WAS NOT CONFIRMED | 2 |
| | RELATIVE DENSITY (%) | 99 | 99 | 99 | 99 | 97 | 98 | 98 | 98 | 99 | 99 | 96 | 98 |
| | AVERAGE CRYSTALLINE PARTICLE DIAMETER (μm) | 9 | 9 | 9 | 9 | 7 | 11 | 4 | 4 | 4 | 3 | 3 | 4 |
| | BULK RESISTANCE (mΩ cm) | 1 | 1 | 1 | 1 | 4 | 11 | 4 | 4 | 1 | 3 | 11 | 8 |
| | UNIFORMITY OF BULK RESISTANCE | ◎ | ◎ | ◎ | ◎ | ◎ | ◎ | ◎ | ◎ | ◎ | ◎ | ◎ | ○ |
| FILM-FORMING OF A SEMICONDUCTOR FILM | SPUTTER METHOD | DC | DC | DC | DC | DC | DC | DC | DC | DC | DC | DC | DC |
| | VARIATION IN FILM-FORMING SPEED | ◎ | ◎ | ◎ | ◎ | ◎ | ◎ | ◎ | ◎ | ◎ | ◎ | ◎ | ○ |
| COMPOSITION RATIO OF A SEMICONDUCTOR FILM | IN/(In + Ga + Zn) | 0.36 | 0.36 | 0.36 | 0.36 | 0.36 | 0.36 | 0.34 | 0.34 | 0.34 | 0.34 | 0.34 | 0.34 |
| | Ga/(In + Ga + Zn) | 0.23 | 0.23 | 0.23 | 0.23 | 0.23 | 0.41 | 0.34 | 0.34 | 0.34 | 0.34 | 0.34 | 0.34 |
| | Zn/(In + Ga + Zn) | 0.41 | 0.41 | 0.41 | 0.41 | 0.41 | 0.44 | 0.32 | 0.32 | 0.32 | 0.32 | 0.32 | 0.32 |
| | In/(In + Ga) | 0.610 | 0.610 | 0.610 | 0.610 | 0.610 | 0.610 | 0.500 | 0.500 | 0.500 | 0.500 | 0.500 | 0.500 |
| | VARIATION OF CONTENT RATIO (%) | 1.1 | 1.1 | 1.1 | 1.1 | 1.1 | 1.1 | 0.0 | 0.0 | 0.0 | 0.0 | 0.0 | 0.0 |
| PROPERTIES OF A THIN | MOBILITY ($cm^2$/Vs) | 20 | 20 | 20 | 20 | 20 | 20 | 9 | 9 | 9 | 9 | 8 | 8 |

TABLE 4-continued

| | | EXAMPLES | | | | | | | | | | |
|---|---|---|---|---|---|---|---|---|---|---|---|---|
| | | 13 | 14 | 15 | 16 | 17 | 18 | 19 | 20 | 21 | 22 | 23 | 24 |
| FILM TRANSISTOR | S VALUE | 0.1 | 0.1 | 0.1 | 0.1 | 0.1 | 0.1 | 0.3 | 0.3 | 0.3 | 0.3 | 0.4 | 0.3 |
| | ON-OFF RATIO | $>10^{10}$ | $>10^{10}$ | $>10^{10}$ | $>10^{10}$ | $>10^{10}$ | $>10^{10}$ | $>10^{10}$ | $>10^{10}$ | $>10^{10}$ | $>10^{10}$ | $>10^{9}$ | $>10^{10}$ |
| | REPRODUC-IBILITY (RATIO IN MOBILITY) | ◎ | ◎ | ◎ | ◎ | ◎ | ◎ | ◎ | ◎ | ◎ | ◎ | ○ | ○ |
| | UNIFORMITY | ◎ | ◎ | ◎ | ◎ | ◎ | ◎ | ◎ | ◎ | ◎ | ◎ | ○ | ○ |

TABLE 5

| | | | EXAMPLES | | | | | | | | | |
|---|---|---|---|---|---|---|---|---|---|---|---|---|
| | | | 1 | 2 | 3 | 4 | 5 | 6 | 7 | 8 | 9 | 10 |
| PRODUCING CONDITIONS OF A SINTERED BODY (A TARGET) | FORMING METHOD | | CIP | CIP | CIP | CIP | CIP | CIP | CIP | CIP | CIP | CIP |
| | SINTERING METHOD | | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE | SINTERING UNDER NORMAL PRESSURE |
| | SINTERING ATMOSPHERE | | OXYGEN | OXYGEN | OXYGEN | OXYGEN | OXYGEN | OXYGEN | OXYGEN | OXYGEN | OXYGEN | OXYGEN |
| | SINTERING TEMPERATURE | | 1300 | 1300 | 1400 | 1300 | 1400 | 1300 | 1400 | 1300 | 1300 | 1400 |
| | SINTERING TIME | | 2 | 120 | 20 | 20 | 2 | 2 | 20 | 20 | 20 | 20 |
| COMPOSITION RATIO OF A SINTERED BODY | In/(In + Ga + Zn) | | 0.35 | 0.35 | 0.35 | 0.333 | 0.33 | 0.33 | 0.33 | 0.5 | 0.01 | 0.3 |
| | Ga/(In + Ga + Zn) | | 0.2 | 0.2 | 0.2 | 0.333 | 0.33 | 0.33 | 0.33 | 0.5 | 0.98 | 0.15 |
| | Zn/(In + Ga + Zn) | | 0.45 | 0.45 | 0.45 | 0.333 | 0.34 | 0.34 | 0.34 | 0 | 0.01 | 0.55 |
| | In/(In + Ga) | | 0.636 | 0.636 | 0.636 | 0.500 | 0.500 | 0.500 | 0.500 | 0.500 | 0.010 | 0.667 |
| METAL HAVING FOUR OR MORE VALENCES IN A SINTERED BODY | KIND OF METAL | | — | — | — | — | — | — | — | — | — | — |
| | CONTENTS (ppm) | | — | — | — | — | — | — | — | — | — | — |
| CRYSTALLINE FORM OF A SINTERED BODY (XRD) | InGaZnO$_4$ | JCPDS CARD No.38-1104 | ◎ | ◎ | ◎ | ◎ | ◎ | ◎ | ◎ | ◎ | ◎ | ◎ |
| | InGaZn$_2$O$_5$ | JCPDS CARD No.40-0252 | — | — | — | — | — | — | — | — | — | — |
| | β-Ga$_2$O$_3$ | JCPDS CARD No.43-1012 | — | — | — | — | — | — | — | — | — | — |
| | ZnGa$_2$O$_4$ | JCPDS CARD No.38-1240 | ○ | ◎ | ◎ | ○ | ○ | ◎ | — | — | — | — |
| | In$_2$O$_3$ | JCPDS CARD No.06-0416 | ○ | — | — | — | — | — | ○ | — | — | ◎ |
| | β-GaInO$_3$ | JCPDS CARD No.21-0334 | — | — | — | — | — | — | — | ◎ | — | — |
| | In$_2$Ga$_2$ZnO$_7$ | JCPDS CARD No.38-1097 | — | — | — | — | — | — | — | — | — | — |
| | In$_2$O$_3$(ZnO)$_7$ | JCPDS CARD No.20-1439 | — | — | — | — | — | — | — | — | — | — |
| | UNKNOWN PEAK BETWEEN 2θ = 62 DEGREE AND 63 DEGREE | | PRESENT | PRESENT | PRESENT | PRESENT | PRESENT | PRESENT | PRESENT | — | PRESENT | ○ |
| | | | 4 | 2000 | 2000 | 6 | 6 | 10000 | | | | |
| | PRESENCE OR ABSENCE OF PEAKS (PEAK BETWEEN 2θ = 62 DEGREE) | | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ | PEAK OF InGaZnO$_4$ |

TABLE 5-continued

| | | | EXAMPLES | | | | | | | | | |
|---|---|---|---|---|---|---|---|---|---|---|---|---|
| | | | 1 | 2 | 3 | 4 | 5 | 6 | 7 | 8 | 9 | 10 |
| PROPERTIES OF A SINTERED BODY | RATIO OF MAXIMUM PEAK | AND 63 DEGREE/ MAXIMUM PEAK OF InGaZnO$_4$) × 100 (%) | 20 | 10000 | 10000 | 6 | 6 | 10000 | WAS NOT CONFIRMED | WAS NOT CONFIRMED | WAS NOT CONFIRMED | WAS NOT CONFIRMED |
| | | (MAXIMUM PEAK OF OTHER THAN InGaZnO$_4$/InGaZnO$_4$ PEAK) × 100 (%) | | | | | | | PEAK OF InGaZnO$_4$ WAS NOT CONFIRMED | PEAK OF InGaZnO$_4$ WAS NOT CONFIRMED | PEAK OF InGaZnO$_4$ WAS NOT CONFIRMED | PEAK OF InGaZnO$_4$ WAS NOT CONFIRMED |
| | RELATIVE DENSITY (%) | | 80 | 98 | 98 | 98 | 97 | 80 | 98 | 98 | 98 | 97 |
| | AVERAGE CRYSTALLINE PARTICLE DIAMETER (μm) | | 3 | 25 | 25 | 7 | 4 | 3 | 25 | 8 | 8 | 8 |
| | BULK RESISTANCE (mΩ cm) | | 130 | 12 | 12 | 10 | 13 | 25 | 35 | >5000 | >5000 | 11 |
| | UNIFORMITY OF BULK RESISTANCE | | X | △ | △ | △ | △ | X | △ | ◎ | ◎ | △ |
| FILM-FORMING OF A SEMICONDUCTOR FILM | SPUTTER METHOD | | DC | DC | DC | DC | DC | DC | DC | RF | RF | DC |
| | VARIATION IN FILM-FORMING SPEED | | △ | X | X | X | X | ◎ | X | ○ | ○ | X |
| SEMICONDUCTOR FILM COMPOSITION RATIO OF A SEMICONDUCTOR FILM | IN/(In + Ga + Zn) | | 0.41 | 0.44 | 0.42 | 0.35 | 0.36 | 0.38 | 0.38 | 0.51 | 0.01 | 0.36 |
| | Ga/(In + Ga + Zn) | | 0.19 | 0.18 | 0.17 | 0.33 | 0.33 | 0.32 | 0.32 | 0.49 | 0.98 | 0.1 |
| | Zn/(In + Ga + Zn) | | 0.4 | 0.39 | 0.41 | 0.32 | 0.31 | 0.31 | 0.31 | 0 | 0.01 | 0.54 |
| | In/(In + Ga) | | 0.683 | 0.710 | 0.712 | 0.515 | 0.522 | 0.543 | 0.543 | 0.510 | 0.010 | 0.783 |
| | VARIATION OF CONTENT RATIO (%) | | 7.4 | 11.5 | 11.9 | 2.9 | 4.3 | 8.6 | 8.6 | 2.0 | 0.0 | 17.4 |
| PROPERTIES OF A THIN FILM TRANSISTOR | MOBILITY (cm$^2$/Vs) | | 19 | 19 | 19 | 6 | 5 | 4 | 5 | — | — | 21 |
| | S VALUE | | 0.2 | 0.2 | 0.2 | 0.8 | 0.9 | 0.9 | 0.9 | — | — | 0.2 |
| | ON-OFF RATIO | | >10$^9$ | >10$^9$ | >10$^9$ | >10$^5$ | >10$^5$ | >10$^5$ | >10$^5$ | — | — | >10$^9$ |
| | REPRODUCIBILITY (RATIO IN MOBILITY) | | X | X | X | △ | △ | X | X | — | — | X |
| | UNIFORMITY | | X | X | X | △ | △ | X | X | — | — | X |

As shown in the above tables, the sintered body (target) of the example within the scope of the present invention has good relative density and uniformity in bulk resistance, valuation of film forming speed at film-forming is little, and nodule is less appeared. The film-formed semi-conductor film using the sintered body (target) of the example has little valuation of content ratio, and reproducibility and uniformity of a thin film transistor are good.

BRIEF DESCRIPTION OF THE DRAWINGS

FIG. 10 Ratio of In and Ga, transistor properties

Figure 1:
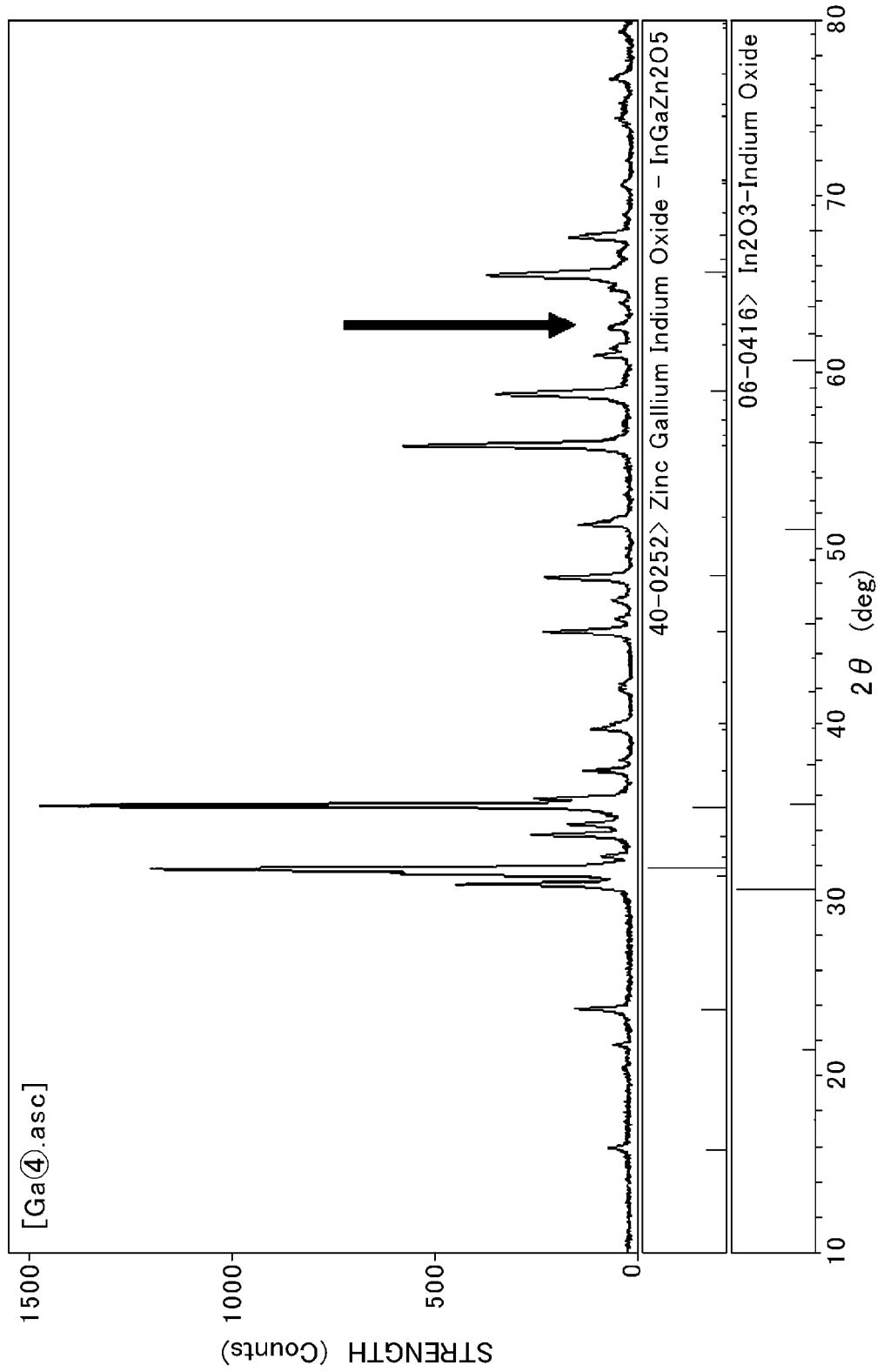
FIG. 1 A chart of X-ray diffraction obtained from Sintering test 1
Figure 2:
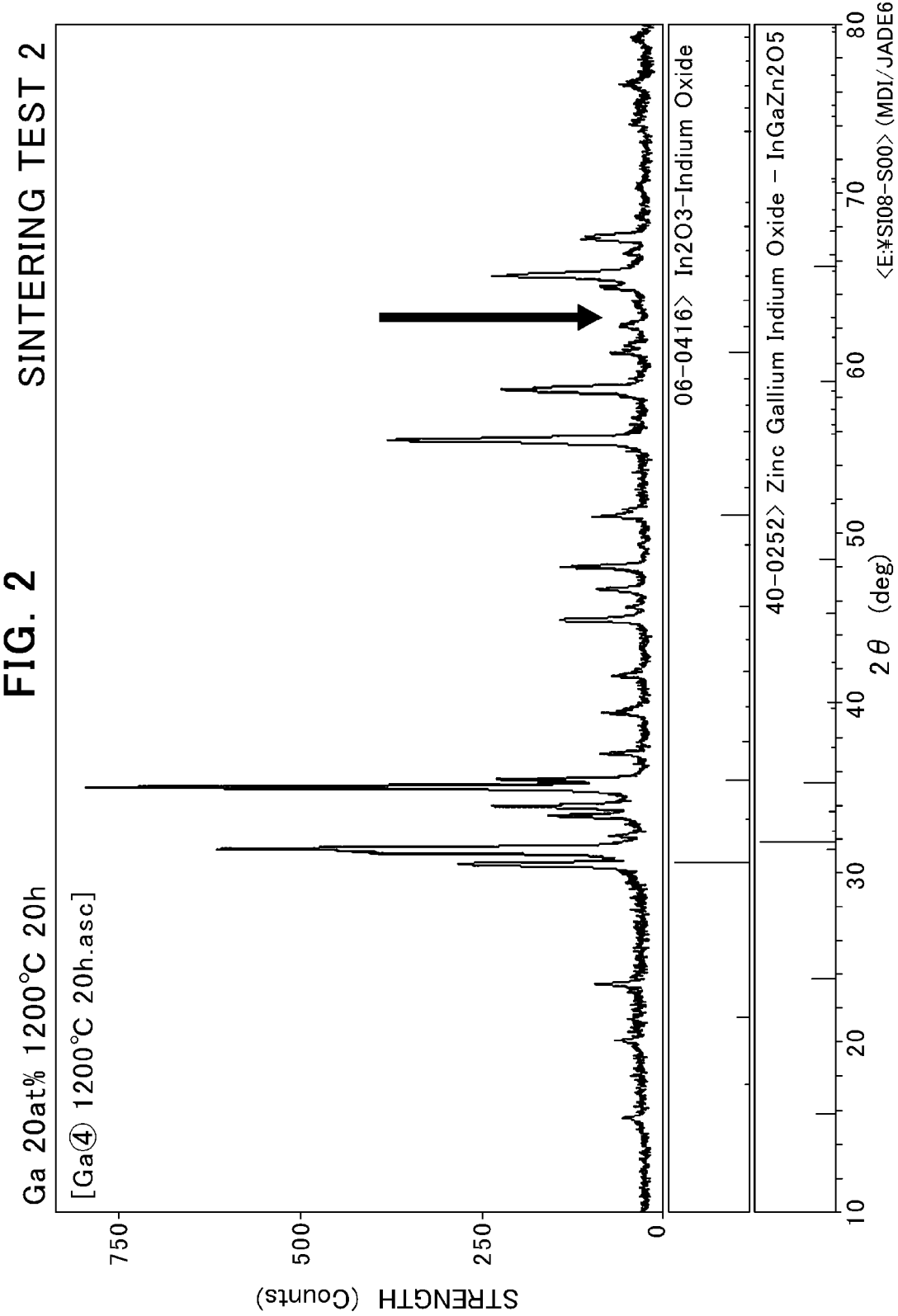
FIG. 2 A chart of X-ray diffraction obtained from Sintering test 2
Figure 3:
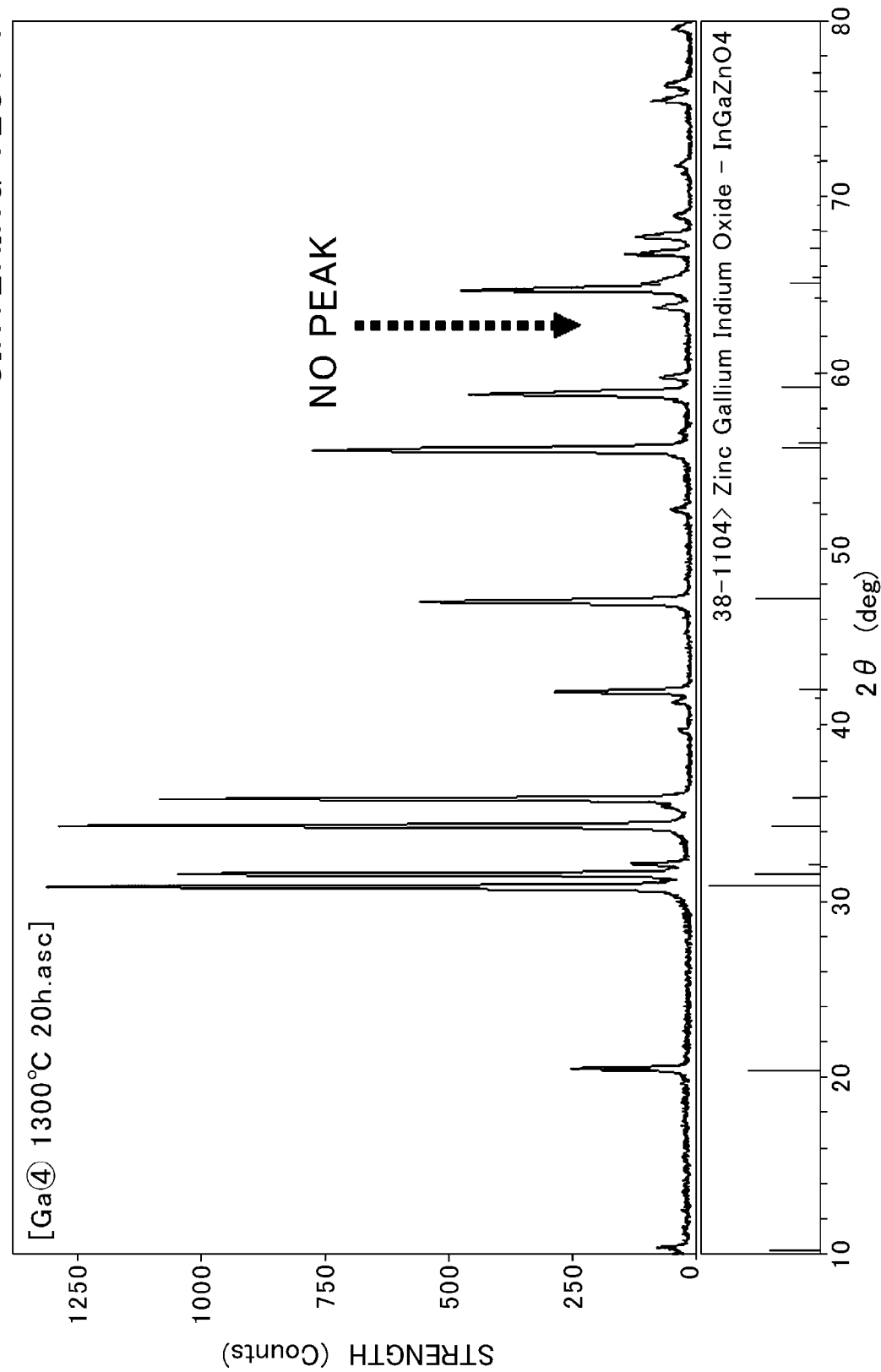
FIG. 3 A chart of X-ray diffraction obtained from Sintering test 4
Figure 4:
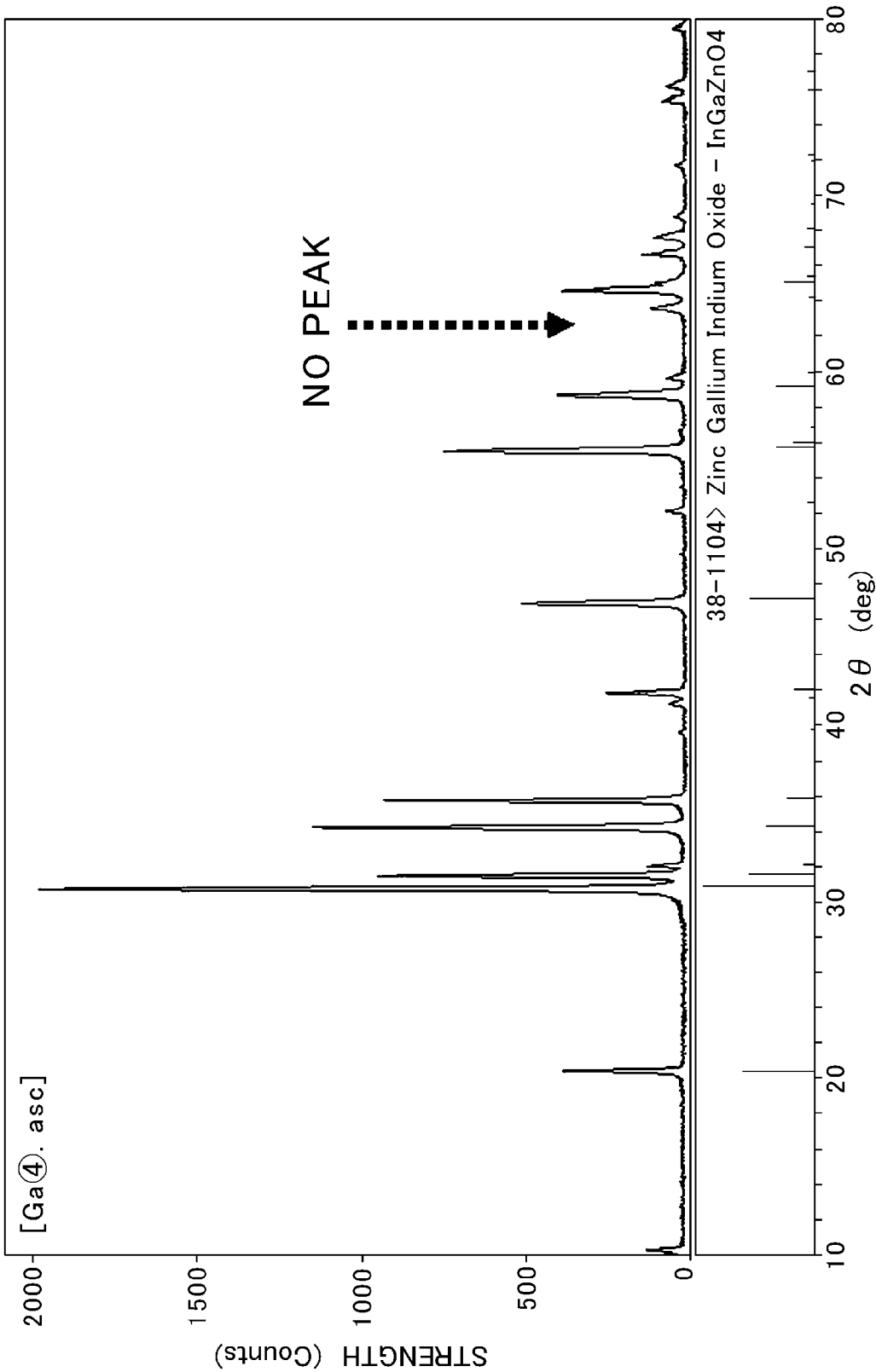
FIG. 4 A chart of X-ray diffraction obtained from Sintering test 5
Figure 5:
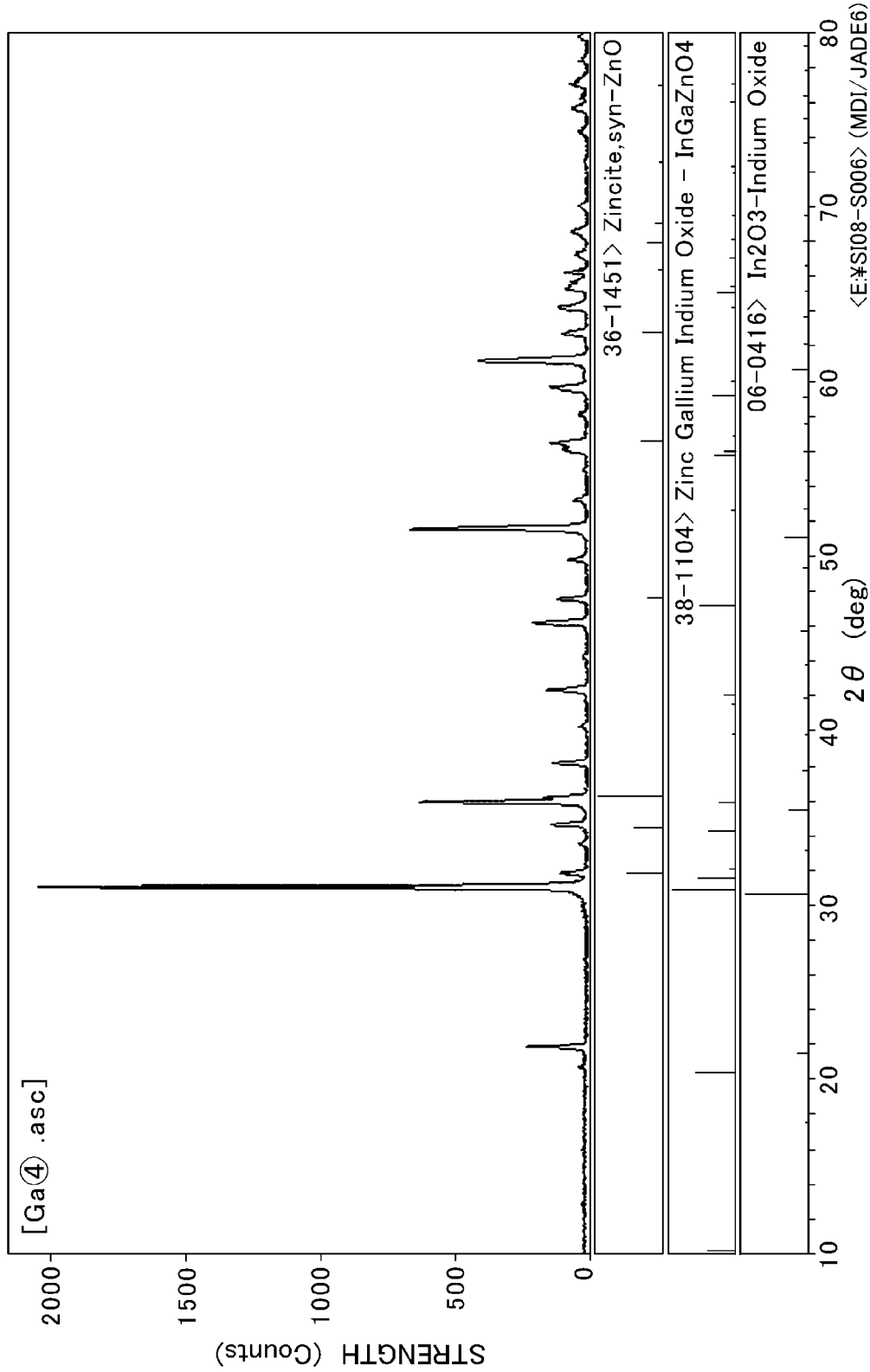
FIG. 5 A chart of X-ray diffraction obtained from Sintering test 6
Figure 6:
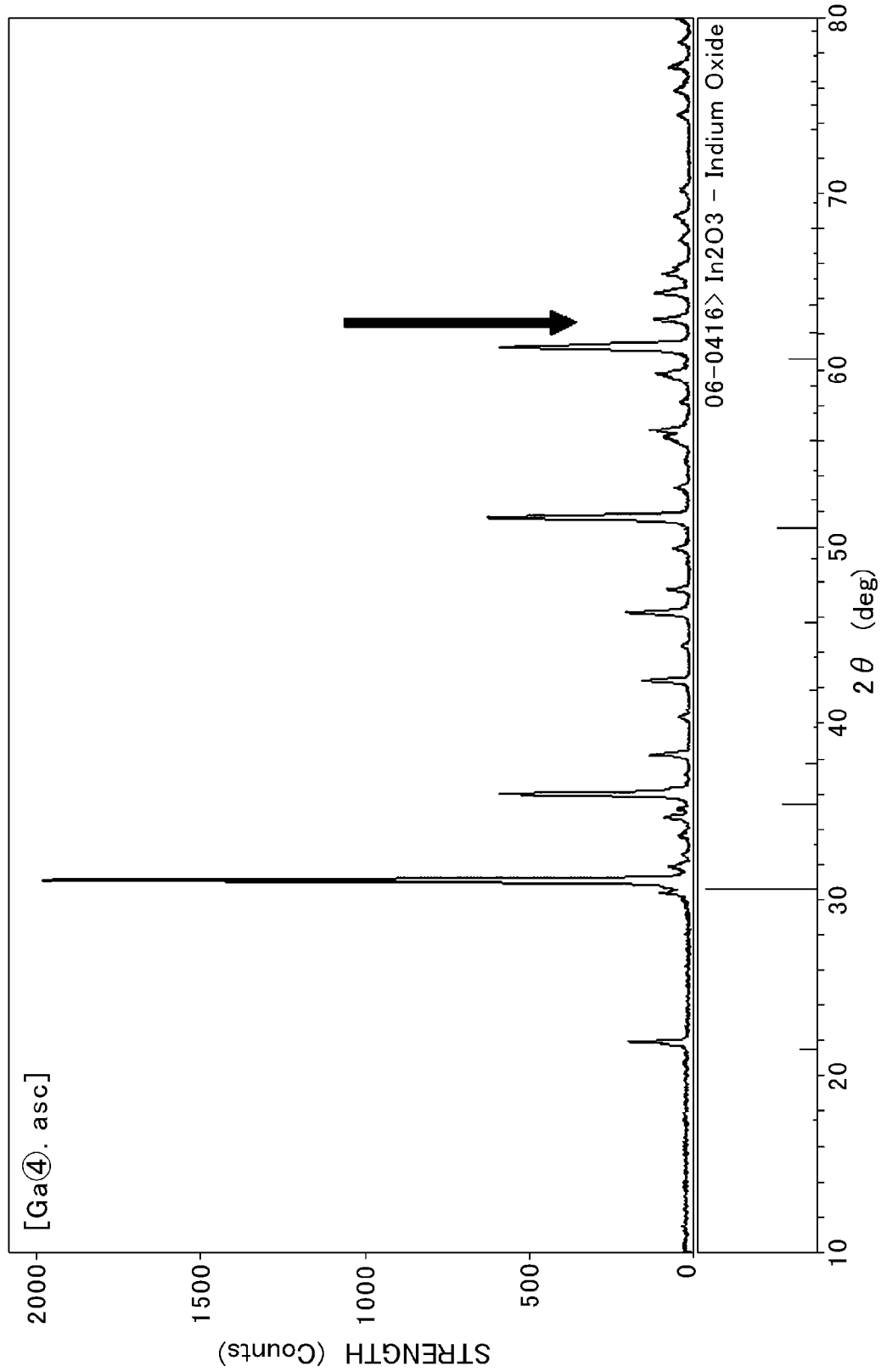
FIG. 6 A chart of X-ray diffraction obtained from Sintering test 7
Figure 7:
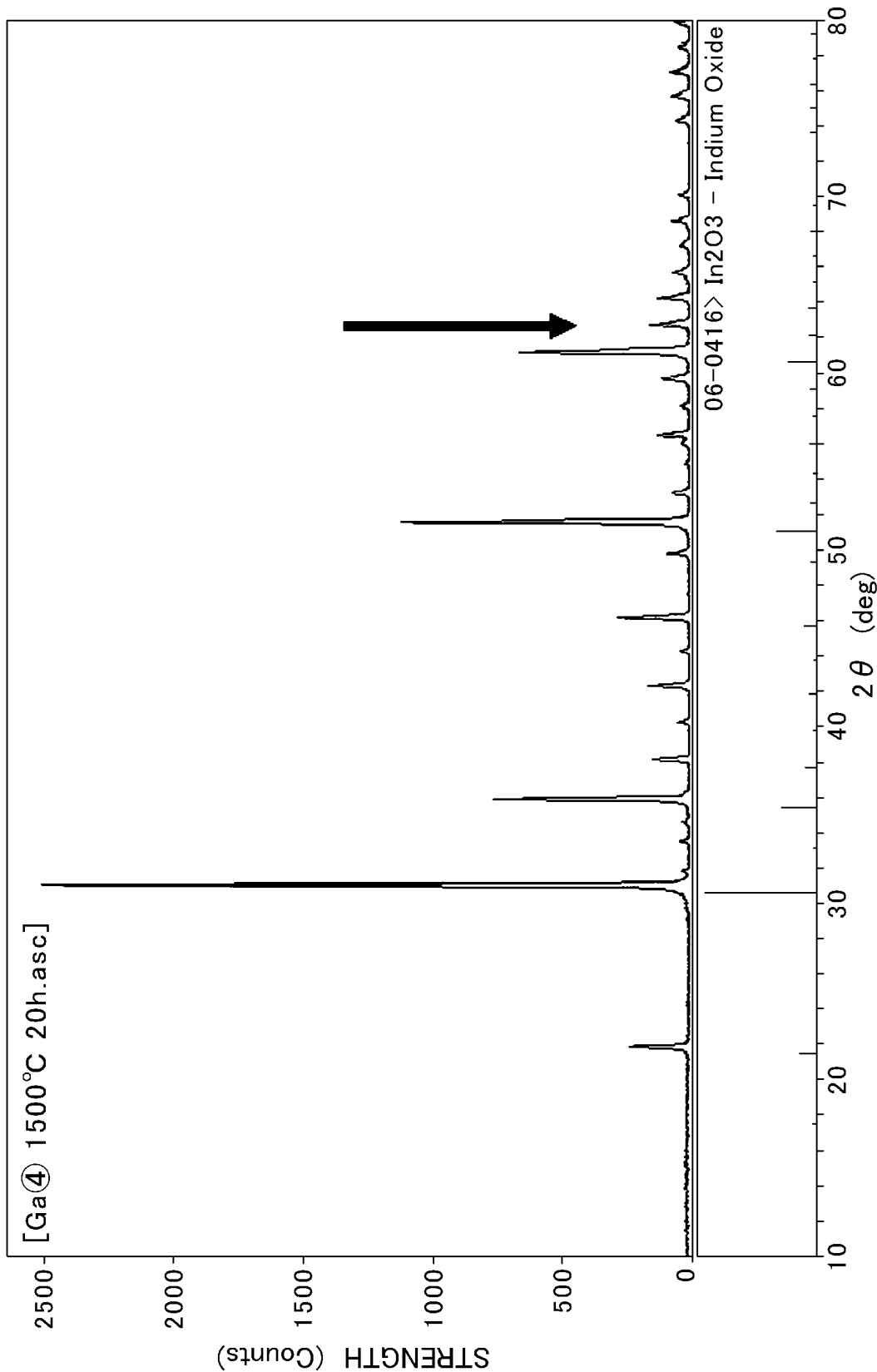
FIG. 7 A chart of X-ray diffraction obtained from Sintering test 8
Figure 8:
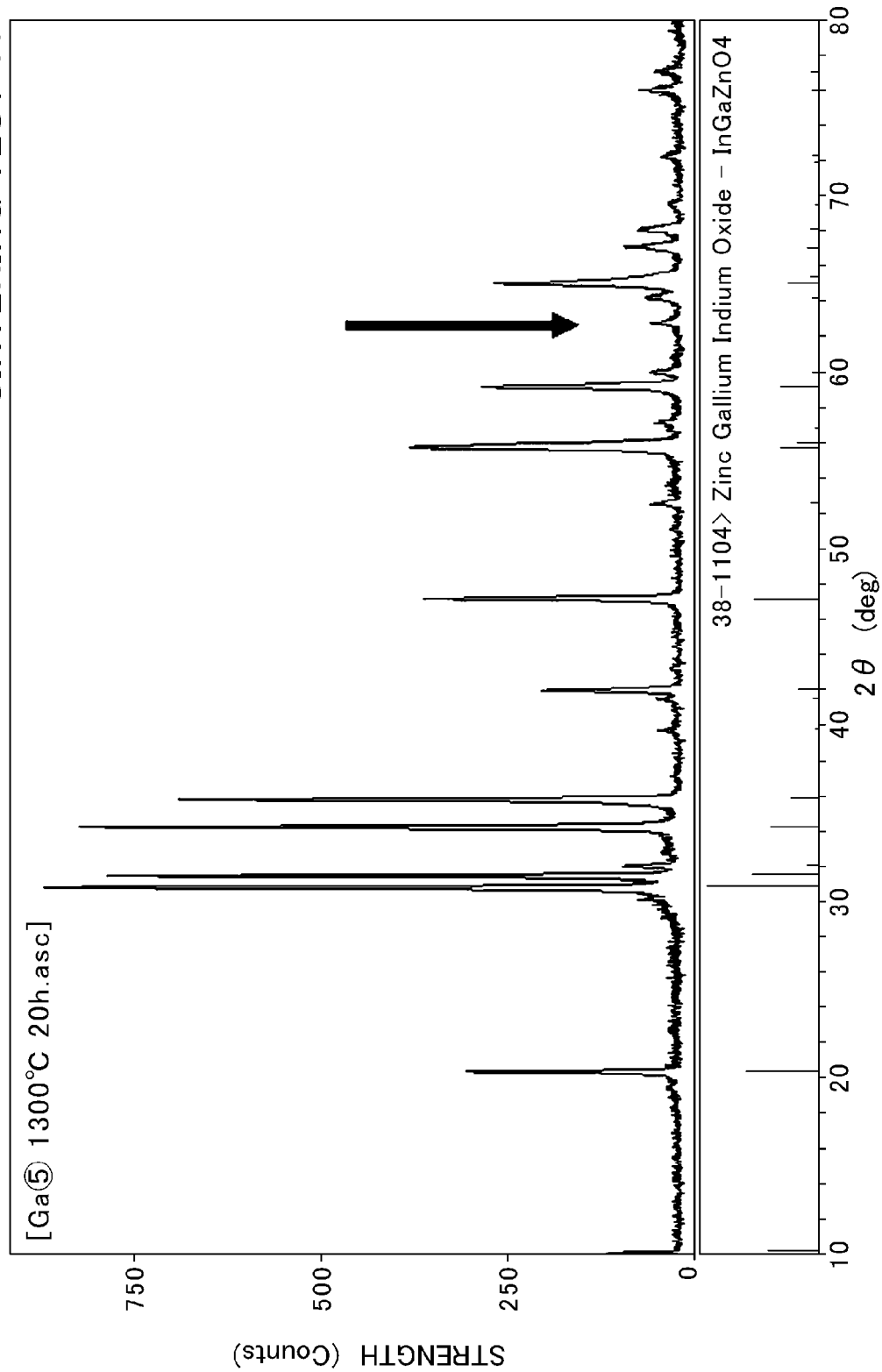
FIG. 8 A chart of X-ray diffraction obtained from Sintering test 11
Figure 9:
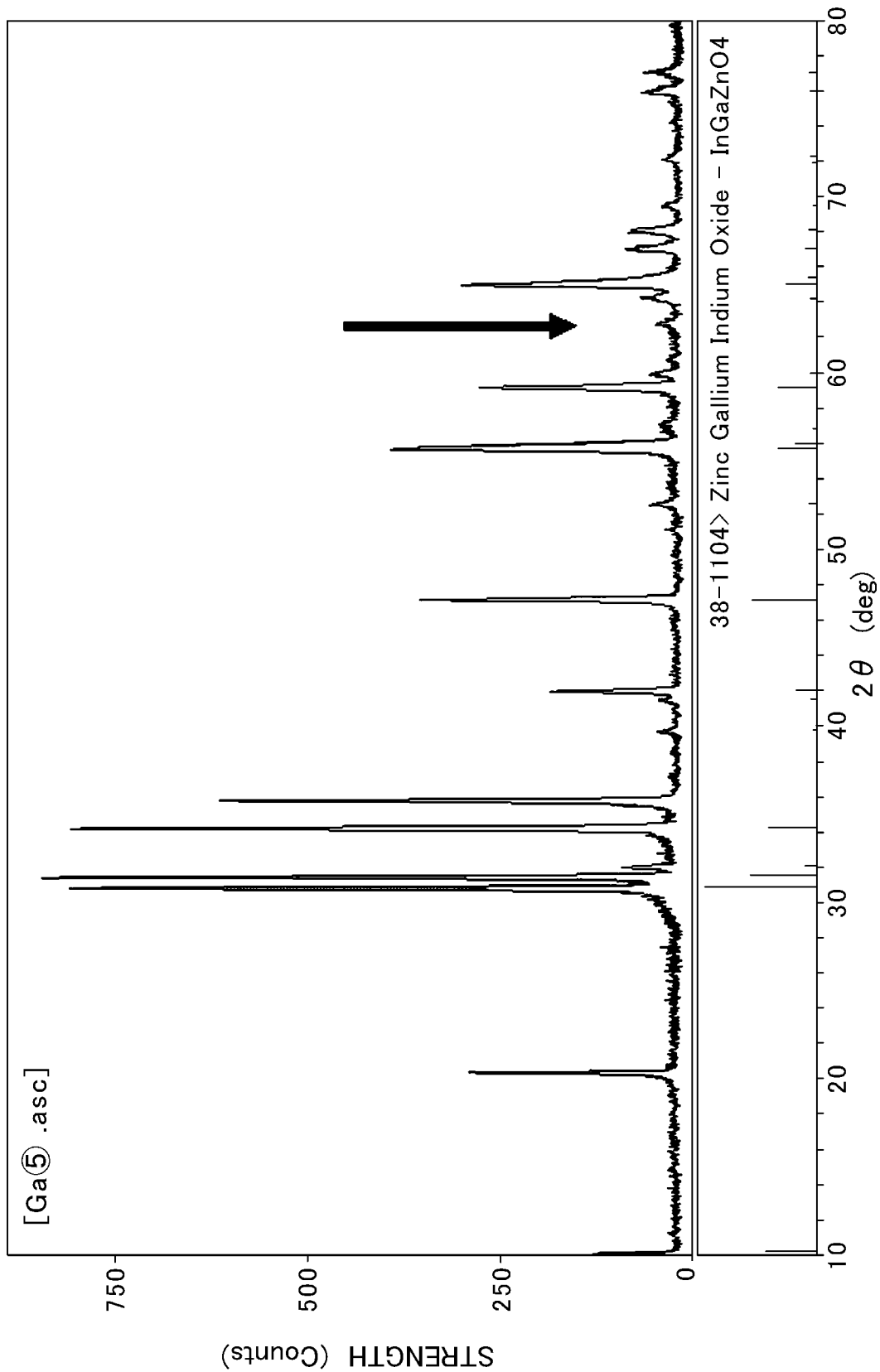
FIG. 9 A chart of X-ray diffraction obtained from Sintering test 18

We claim:

1. A sputtering target comprising an element having positive four or more valences in an amount of 100 to 10000 ppm and an oxide sintered body wherein said oxide sintered body consists of a compound having only a homologous crystal structure represented by $InGaO_3(ZnO)$,
    wherein a peak between $2\theta=62$ degree and 63 degree based on X-ray diffraction is 3% or less of a maximum peak of $InGaO_3(ZnO)$, wherein a ratio of maximum value of bulk resistance/minimum value of bulk resistance is up to 10, and
    in which an atom ratio other than oxide meets the following formula: $Ga/(In+Zn+Ga) \leq 0.26$.

2. The sputtering target of claim 1, in which atom ratio other than oxide meets the following formulae:

$0.20 \leq In/(In+Zn+Ga) \leq 0.60$, $0.10 \leq Ga/(In+Zn+Ga) \leq 0.26$, $0.10 \leq Zn/(In+Zn+Ga)$.

3. The sputtering target of claim 1, in which said oxide sintered body has a relative density of 95% or more, an average crystalline particle diameter of 20 μm or less, and a bulk resistance of 20 mΩcm or less.

4. A method for preparing the sputtering target of claim 1 composed of an oxide sintered body comprising In, Zn and Ga, said method comprising sintering a formed body of an oxide containing a composite oxide.

5. The method of claim 4, wherein said composite oxide contains In, Zn and Ga.

6. The method of claim 4, in which the formed body comprises one or more composite oxides selected from a composite oxide containing In and Zn, a composite oxide containing In and Ga, and a composite oxide containing Ga and Zn.

7. A method for preparing the sputtering target of claim 1, composed of an oxide sintered body, said method comprising forming a composite oxide powder.

8. The method of claim 7, in which sintering is conducted simultaneously with press forming during said forming.

9. A method for preparing the sputtering target of claim 1 composed of an oxide sintered body comprising In, Zn and Ga, which method comprises sintering a formed body meeting the following formula of atom ratio other than oxide $Ga/(In+Zn+Ga)<In/(In+Zn+Ga)$.

10. The method of claim 9, wherein said formed body meets the following formula of atom ratio other than oxide:

$0.51 \leq In/(In+Ga) \leq 0.86$, $0.20 \leq In/(In+Zn+Ga) \leq 0.60$, $0.10 \leq Ga/(In+Zn+Ga) \leq 0.26$.

11. The method of claim 9, further comprising forming a crude powder so as to obtain said formed body, and wherein sintering of said formed body is performed at 1230 to 1350° C. for 3 to 60 hours, or at 1350 to 1450° C. for 0.5 to 8 hours.

12. The method of claim 9 in which the sintering is conducted under oxygen containing atmosphere.

13. A method for forming an amorphous oxide semi-conductor film comprising forming an amorphous oxide semi-conductor film having specific resistance of $10^{-1}$ to $10^8$ Ωcm by a sputtering method using the sputtering target of claim 1.

14. The method for forming an amorphous oxide semi-conductor film of claim 13 in which said amorphous oxide semi-conductor film is formed as a channel layer of a thin film transistor.

15. The sputtering target of claim 1, in which atom ratio other than oxide meets the following formulae:

$0.25 \leq In/(In+Zn+Ga) \leq 0.60$, $0.17 \leq Ga/(In+Zn+Ga) \leq 0.26$, $0.21 \leq Zn/(In+Zn+Ga) \leq 0.60$.

16. The sputtering target of claim 1, in which atom ratio other than oxide meets the following formula: $Ga/(In+Zn+Ga) \leq 0.2$.

17. The sputtering target of claim 1, in which atom ratio other than oxide meets the following formulae:

$0.34 \leq In/(In+Zn+Ga) \leq 0.50$, $0.17 \leq Ga/(In+Zn+Ga) \leq 0.26$, $0.24 \leq Zn/(In+Zn+Ga) \leq 0.49$.

* * * * *